United States Patent
McCallister

(10) Patent No.: US 9,093,960 B2
(45) Date of Patent: Jul. 28, 2015

(54) TRANSMITTER AND METHOD WITH RF POWER AMPLIFIER HAVING PREDISTORTED BIAS

(71) Applicant: CrestCom, Inc., Scottsdale, AZ (US)

(72) Inventor: Ronald Duane McCallister, Scottsdale, AZ (US)

(73) Assignee: CrestCom, Inc., Scottsdale, AZ (US)

( * ) Notice: Subject to any disclaimer, the term of this patent is extended or adjusted under 35 U.S.C. 154(b) by 119 days.

(21) Appl. No.: 13/949,962

(22) Filed: Jul. 24, 2013

(65) Prior Publication Data

US 2015/0031318 A1 Jan. 29, 2015

(51) Int. Cl.
| | |
|---|---|
| H04B 1/04 | (2006.01) |
| H03F 1/32 | (2006.01) |
| H03F 3/193 | (2006.01) |
| H04B 1/62 | (2006.01) |
| H03F 1/02 | (2006.01) |
| H03F 3/217 | (2006.01) |

(Continued)

(52) U.S. Cl.
CPC ............ *H03F 1/3247* (2013.01); *H03F 1/0222* (2013.01); *H03F 3/193* (2013.01); *H03F 3/2171* (2013.01); *H03F 3/245* (2013.01); *H03F 3/45475* (2013.01); *H04B 1/62* (2013.01); *H03F 2200/432* (2013.01)

(58) Field of Classification Search
CPC ................... H03F 2200/451; H03F 2200/432; H03F 1/3247; H03F 3/193; H03F 1/0222; H03F 3/2171; H03F 3/245; H03F 3/45475; H03G 3/3042
USPC ...................................................... 455/127.1
See application file for complete search history.

(56) References Cited

U.S. PATENT DOCUMENTS

| 7,570,931 B2 * | 8/2009 | McCallister et al. .......... 455/126 |
| 7,741,903 B2 * | 6/2010 | Vinayak et al. ............... 330/127 |

(Continued)

FOREIGN PATENT DOCUMENTS

WO    2012061038 A1    5/2012

OTHER PUBLICATIONS

P. Asbeck et al., "Efficiency and Linearity Improvement in Power Amplifiers for Wireless Communications", Gallium Arsenide Integrated Circuit (GaAs IC) Symposium, Nov. 1-4, 1998, pp. 15-18, University of California, CA.

(Continued)

*Primary Examiner* — Christian Hannon
(74) *Attorney, Agent, or Firm* — Schmeiser, Olsen & Watts LLP; Lowell W. Gresham

(57) ABSTRACT

A transmitter (32) generates a time-varying stabilized bias signal (82) from which sub-RF distortion signals (26, 29) have been cancelled. The distortion signals (26, 29) are byproducts of imperfect amplification and of biasing networks. An envelope amplifier (84) includes a high bandwidth differential input, linear, bias signal amplifier (120) and a low bandwidth switching amplifier (122) coupled together to achieve both a high bandwidth and high efficiency. A control loop (154) feeds a portion of the voltage V(t) from a conduction node (146) of the RF power amplifier (36) to one of the differential inputs of the linear bias signal amplifier (120), while a bias control signal (92) drives the other differential input. The portion of voltage V(t) fed to bias signal amplifier (120) is a low power portion from which the RF portion has been removed. A bias signal (128) may be predistorted to cancel distortion signals (26, 29).

28 Claims, 7 Drawing Sheets

(51) Int. Cl.
H03F 3/24 (2006.01)
H03F 3/45 (2006.01)

(56) References Cited

U.S. PATENT DOCUMENTS

| | | | |
|---|---|---|---|
| 7,792,214 | B2 | 9/2010 | Matsuura et al. |
| 8,093,946 | B2 | 1/2012 | Wimpenny et al. |
| 8,909,175 | B1 * | 12/2014 | McCallister ............... 455/114.3 |
| 2003/0146790 | A1 | 8/2003 | Arell et al. |
| 2007/0281635 | A1 | 12/2007 | McCallister et al. |
| 2009/0097590 | A1 | 4/2009 | McCallister et al. |
| 2009/0273399 | A1 | 11/2009 | Wang |
| 2010/0184389 | A1 | 7/2010 | Fraysse et al. |
| 2011/0018632 | A1 | 1/2011 | Pletcher et al. |
| 2012/0106676 | A1 | 5/2012 | McCallister et al. |
| 2012/0286873 | A1 | 11/2012 | Li et al. |
| 2013/0027129 | A1 | 1/2013 | Langer |

OTHER PUBLICATIONS

Jinsung Choi et al., "A Polar Transmitter With CMOS Programmable Hysteretic-Controlled Hybrid Switching Supply Modulator for Multistandard Applications", IEEE Transactions on Microwave Theory and Techniques, Jul. 2009, pp. 1675-1686, vol. 57, No. 7, USA.

Christian Fager et al., "A Comprehensive Analysis of IMD Behavior in RF CMOS Power Amplifiers", IEEE Journal of Solid-State Circuits, Jan. 2004, pp. 24-34, vol. 39, No. 1, USA.

Gary Hanington et al., "High-Efficiency Power Amplifier Using Dynamic Power-Supply Voltage for CDMA Applications", IEEE Transactions on Microwave Theory and Techniques, Aug. 1999, pp. 1471-1476, vol. 47, No. 8, USA.

Muhammad Hassan et al., "A CMOS Dual-Switching Power-Supply Modulator with 8% Efficiency Improvement for 20MHz LTE Envelope Tracking RF Power Amplifiers", 2013 IEEE International Solid-State Circuits Conference, 2013, pp. 366-368, USA.

Muhammad Hassan et al., "A Wideband CMOS/GaAs HBT Envelope Tracking Power Amplifier for 4G LTE Mobile Terminal Applications", IEEE Transactions on Microwave Theory and Techniques, May 2012, pp. 1321-1330, vol. 60, No. 5, USA.

Jim Holdahl et al., "Demystifying Buck Inductors", Jul. 1, 2001, pp. 1-3, Powerelectronics.com.

Chin Hsia, "Envelope Amplifier Design for Wireless Base-Station Power Amplifiers", A dissertation submitted in partial satisfaction of the requirements for the degree Doctor of Philosophy, 2010, pp. 1-149, University of California, San Diego.

Jinseong Jeong et al., "High-Efficiency WCDMA Envelope Tracking Base-Station Amplifier Implemented With GaAs HVHBTs", IEEE Journal of Solid State Circuits, Oct. 2009, pp. 2629-2639, vol. 44, No. 10, USA.

Jinseong Joeng et al., "Modeling and Design of RF Amplifiers for Envelope Tracking WCDMA Base-Station Applications", IEEE Transactions on Microwave Theory and Techniques, Sep. 2009, pp. 2148-2159, vol. 57, No. 9, USA.

Jinseong Jeong et al., "Wideband Envelope Tracking Power Amplifiers With Reduced Bandwidth Power Supply Waveforms and Adaptive Digital Predistortion Techniques", IEEE Transactions on Microwave Theory and Techniques, Dec. 2009, pp. 3307-3314, vol. 57, No. 12, USA.

Donald F. Kimball et al., "High-Efficiency Envelope-Tracking W-CDMA Base-Station Amplifier Using GaN HFETs", IEEE Transactions on Microwave Theory and Techniques, Nov. 2006, pp. 3848-3856, vol. 54, No. 11, USA.

Myoungbo Kwak et al., "Design of a Wideband High-Voltage High-Efficiency BiCMOS Envelope Amplifier for Micro-Base-Station RF Power Amplifiers", IEEE Transactions on Microwave Theory and Techniques, Jun. 2012, pp. 1850-1861, vol. 60, No. 6, USA.

Vincent W. Leung et al., "Analysis of Envelope Signal Injection for Improvement of RF Amplifier Intermodulation Distortion", IEEE Journal of Solid-State Circuits, Sep. 2005, pp. 1888-1894, vol. 40, No. 9, USA.

NITRONEX, NPT2010, Gallium Nitride 48V, 100W, DC-2.2 GHz HEMT, Data Sheet, 2013, pp. 1-10, USA.

Sumitomo Electric, EGN21C320IV, Data Sheet, Edition 2, May 2013, pp. 1-8, USA.

Peter Asbech et al., "CMOS Handset Power Amplifiers: Directions for the Future", Custom Integrated Circuits Conference (CICC), 2012 IEEE, Sep. 9-12, pp. 1-6, San Jose, CA.

Feipeng Wang et al., "A Monolithic High-Efficiency 2.4-GHz 20-dBm SiGe BiCMOS Envelope-Tracking OFDM Power Amplifier", IEEE Journal of Solid-State Circuits, Jun. 2007, pp. 1271-1281, vol. 42, No. 6, USA.

Steve C. Cripps, "RF Power Amplifiers for Wireless Communications", 2nd ed.—(Artech House Microwave Library) 2006, pp. i-viii, and pp. 337-358, USA.

M. Reza Ghajar et al., "Backgate Modulation Technique for Higher Efficiency Envelope Tracking", IEEE Transactions on Microwave Theory and Techniques, Apr. 2013, pp. 1599-1607, vol. 61, No. 4, USA.

Jungjoon Kim et al., "Optimization of Envelope Tracking Power Amplifier for Base-Station Applications", IEEE Transactions on Microwave Theory and Techniques, Apr. 2013, pp. 1620-1627, vol. 61, No. 4, USA.

Bumman Kim et al., "Push the Envelope", IEEE Microwave Magazine, IMS Special Issue May 2013, pp. 68-81, USA.

Ruili Wu et al., "High-Efficiency Silicon-Based Envelope-Tracking Power Amplifier Design With Envelope Shaping for Broadband Wireless Applications", IEEE Journal of Solid-State Circuits, Sep. 2013, pp. 1-11, vol. 48, No. 9, USA.

Patent Cooperation Treaty, International Search Report and Written Opinion of International Application No. PCT/US14/45939, Jan. 2, 2015, pp. 1-16, ISA/US.

* cited by examiner

TRANSMITTER AND METHOD WITH RF POWER AMPLIFIER HAVING PREDISTORTED BIAS

TECHNICAL FIELD OF THE INVENTION

The present invention relates generally to the field of radio-frequency (RF) communication systems. Specifically, the present invention relates to RF transmitters that stabilize RF power amplifier biasing signals to improve transmitter linearity and power-added efficiency.

BACKGROUND OF THE INVENTION

An RF power amplifier provides the final stage of amplification for a communication signal that has been modulated and converted into an RF signal. Often that RF signal exhibits frequencies in a predetermined RF frequency band licensed by a regulatory agency for a particular use. The RF power amplifier boosts the power of this RF communication signal to a level sufficient so that the signal, when it propagates to an antenna, will be broadcast in such a manner that it will meet the communication goals of the RF transmitter.

Many popular modern modulation techniques, such as CDMA, QAM, OFDM, and the like, require the RF power amplifier to perform a linear amplification operation. In other words, the RF communication signal conveys both amplitude and phase information, and the RF power amplifier should faithfully reproduce both the amplitude and phase content of the RF signal presented to it. While perfect linearity is a goal for any linear RF power amplifier, all linear RF power amplifiers invariably fail to meet it. The degree to which the goal of perfect linearity is missed leads to unwanted intermodulation, distortion, and spectral regrowth. Spectral regrowth refers to an expansion of the bandwidth of an RF communication signal. Governmental regulatory agencies define spectral masks which impose stringent constraints on the spectral emissions from transmitters. Even small amounts of spectral regrowth can cause the transmitter to violate regulatory requirements.

In addition to linearity requirements set through spectral masks, power-added efficiency (PAE) is another parameter of interest to those who design RF transmitters. PAE is the ratio of the RF output power to the sum of the input RF power and the applied bias-signal power. An amplifier that has low PAE wastes power, which is undesirable in any transmitter, but particularly undesirable in battery-powered transmitters because it necessitates the use of undesirably large batteries and/or undesirably frequent recharges. Conventionally, improvements in PAE have been achieved at the expense of linearity. But envelope-tracking (ET) techniques, envelope elimination and restoration (EER) techniques, and hybrids between the two techniques have shown promise for achieving PAE improvements.

Generally, envelope tracking (ET), envelope elimination and restoration (EER), and hybrids of the two refer to techniques for biasing an RF power amplifier using an intentionally applied, time-varying bias signal, where the bias signal varies in time to at least roughly track the envelope of the RF communication signal. The goal of such techniques is to provide a time-varying bias signal to a bias feed network that maintains the bias voltage and current between the conduction nodes of the RF amplifying device at a level no greater than it needs to be to achieve respectably linear amplification.

Those who design RF transmitters understand that different RF power amplifier limitations lead, directly and indirectly, to different types of nonlinearities. One of these nonlinearities results indirectly from an unwanted amplifier-generated low-frequency distortion signal referred to as a video signal or a baseband signal. In particular, RF power amplifiers tend to generate unwanted harmonics of the fundamental RF communication signal being amplified along with the desired amplified fundamental RF communication signal. Filters are often used to remove or otherwise block the harmonics from being broadcast from the transmitter. But the even harmonics have sub-RF byproducts below the fundamental in frequency, extending upward from zero Hz, and these amplifier-generated, sub-RF byproducts represent one form of troublesome distortion.

In some RF power amplifiers additional mechanisms may be present to generate other forms of troublesome sub-RF distortion. For example, the intentionally applied time-varying bias signal used in accordance with an ET, EER, or hybrid biasing scheme is applied through a biasing network to a conduction channel node of an RF power amplifier. The action of the biasing network in combination with the RF power amplifier distorts the time-varying bias signal at the conduction channel node of the RF power amplifier. Typically, the intentionally applied bias signal and its distortion vary in time within roughly the same sub-RF bandwidth as the video signal. These sub-RF, amplifier-generated and bias-generated distortion signals represent sub-RF energy that extends upward from zero Hz, perhaps for a few spans of the bandwidth of the RF communication signal being amplified. While these sub-RF distortion signals are not broadcast from the transmitter, they may nevertheless impede efforts to improve linearity and PAE.

A typical RF amplifier uses an RF amplifying device which is fed a biasing voltage through the biasing network. The amplifier-generated sub-RF distortion signal causes a time-varying voltage to develop across the biasing network, which causes a corresponding and unwanted time-varying voltage modulation of the desired bias voltage applied across conduction nodes of the RF amplifying device. The intentionally applied, time-varying bias signal causes both a wanted time-varying voltage modulation of the bias voltage and an unwanted distortion modulation which occupies substantially the same or a greater bandwidth as the time-varying bias signal. The sub-RF distortion signals can lead to unwanted intermodulations between the sub-RF distortion signals and the RF fundamental signal. The intermodulation causes the RF power amplifier to generate an RF distortion signal which resides in the bandwidth of the fundamental RF signal and extends outside the bandwidth of the fundamental RF signal. This type of RF distortion signal is undesirable because it reduces the signal-to-noise ratio of the transmitted RF signal. But it is highly undesirable due to the spectral regrowth which often must be corrected in order for the transmitter to comply with its spectral mask. Thus, the sub-RF distortion signals cause the RF amplifying device's bias signal to be less stable than desired. Without this sub-RF distortion signal form of bias corruption, linearity and PAE would improve.

Conventional transmitters have addressed the sub-RF distortion problem in at least a few different ways. In one way, the biasing network is configured to implement a series of resonant impedance notches distributed throughout a bandwidth of the sub-RF distortion signal. This technique lowers the overall impedance of the bias network in the sub-RF distortion signal bandwidth, which in turn attenuates the sub-RF distortion signals and reduces the unwanted intermodulation. Unfortunately, this technique does not work well for wide bandwidth signals. One of the requirements of a bias network is to exhibit very high impedance to the amplified fundamental RF signal. For wide bandwidth communication signals it becomes increasingly difficult to configure a biasing network to exhibit adequately low impedance throughout a wide sub-RF distortion signal bandwidth yet exhibit adequately high impedance at the fundamental RF frequency. And, the inclusion of resonant notches in the biasing network is undesirable because it worsens another type of nonlinearity, referred to as "memory effects". The memory-effect nonlinearities are particularly undesirable because they are difficult to compensate using predistortion techniques which require reasonable computational abilities and consume little power.

In accordance with another technique for addressing the sub-RF distortion signal problem, baseband digital signal processing circuits predict the bias signal corruption that will be caused by the sub-RF distortion signal, then predistort the digital baseband form of the communication signal in a way that will, after upconversion and amplification in the RF power amplifier, compensate for the intermodulation distortion that the sub-RF distortion signal causes. This technique does not rely upon the use of several sub-RF distortion signal bandwidth resonant notches in the biasing network and is effective in reducing the unwanted intermodulation distortion caused by the sub-RF distortion signal. But the bias signal fed to the amplifying device remains less stable in the sub-RF distortion bandwidth than desired.

In accordance with yet another technique for addressing the sub-RF distortion problem, RF power amplifiers have been operated in a significantly de-tuned state where they perform linear amplification regardless of sub-RF distortions that may be present. In other words, the RF amplifiers may be designed so that in theory they are biased and otherwise operated well within the boundaries of linear operation, and not near such boundaries. Any sub-RF distortion may cause actual operation of the RF amplifiers much closer to such boundaries of linear operation, but do not cause overtly nonlinear operation. Unfortunately, this technique wastes power and reduces PAE.

Unfortunately, the sub-RF distortion signals are believed to add a component of bias variation which prevents envelope tracking techniques from achieving desired levels of improvement in PAE.

What is needed is an RF transmitter having an RF power amplifier that achieves both improved PAE and improved linearity by stabilizing the bias applied to RF amplifying devices and by avoiding the excessive use of resonant notches in the biasing network.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION OF THE PREFERRED EMBODIMENTS

Figure 1:
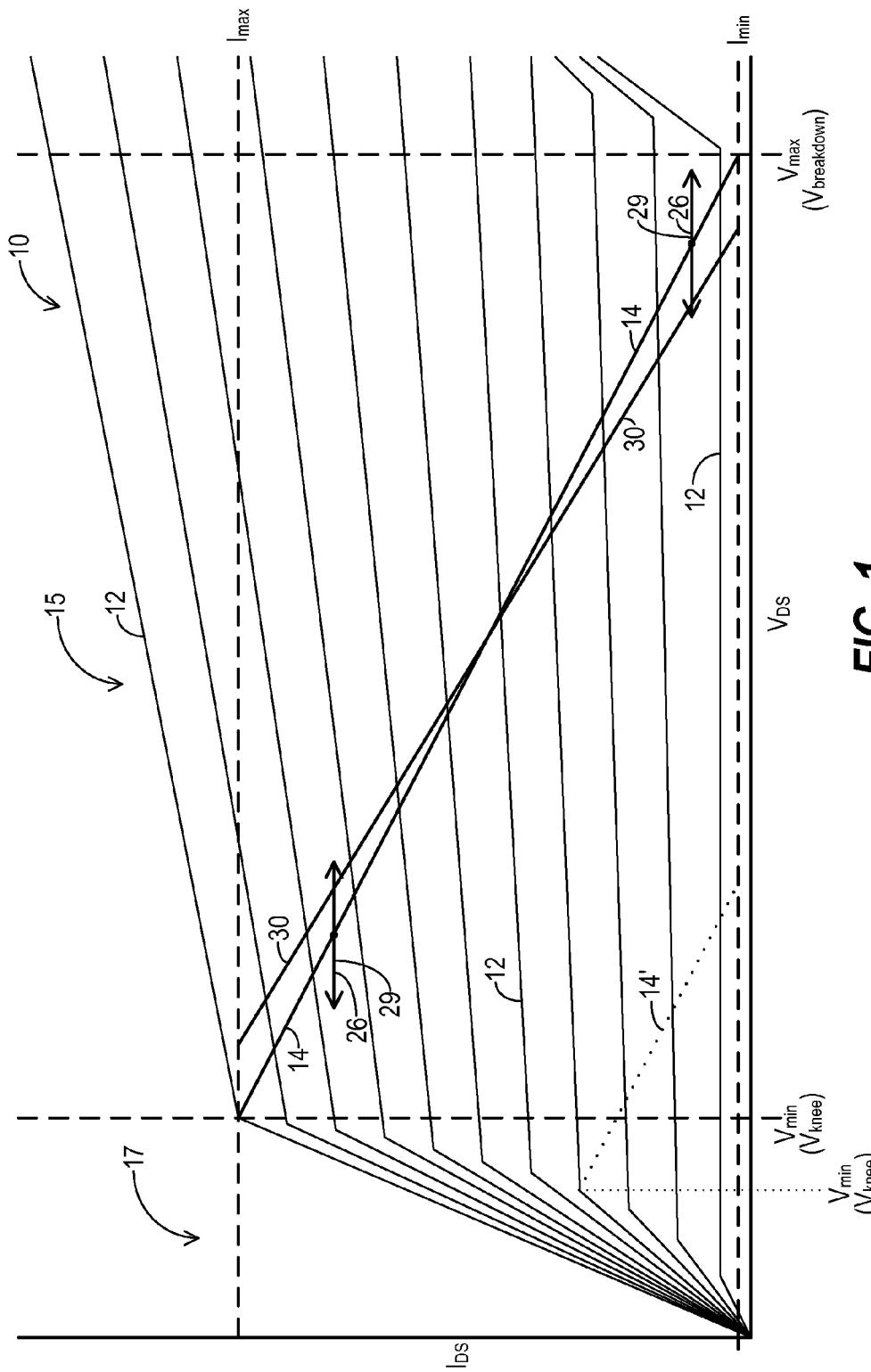
FIG. 1 shows a chart depicting a representative family of transfer characteristics of a representative RF power amplifier.

FIG. 1 shows a chart depicting a representative family 10 of transfer curves 12 for a representative RF amplifying device (not shown) using field effect transistor (FET) nomenclature. The basic relationships shown in FIG. 1 apply to other types of RF amplifying devices as well. Current $I_{DS}$ flowing through a conduction channel of the RF amplifying device between its drain and source conduction nodes is represented along the vertical axis, and voltage $V_{DS}$ across the drain and source conduction nodes is represented along the horizontal axis. A different transfer curve 12 is presented for each of several different levels for an input signal $V_{GS}$ presented to the RF amplifying device across gate and source nodes.

An optimal load line 14 extends between the knee voltage ($V_{knee}$) for $V_{DS}$ at a high level of input signal $V_{GS}$, and the breakdown voltage ($V_{breakdown}$) for $V_{DS}$ at a lower level of the input signal $V_{GS}$. Optimal load line 14 is defined by amplifier characteristics in combination with the load applied at the output of the amplifier. At an upper left-most point on optimal load line 14, the RF amplifying device's conduction channel is at high current $I_{DS}$ but low voltage $V_{DS}$. At a lower right-most point for optimal load line 14, the RF amplifying device's conduction channel is at low current $I_{DS}$ but high voltage $V_{DS}$.

The region between $V_{knee}$ at high $V_{GS}$ and low $V_{DS}$ and $V_{breakdown}$ at low $V_{GS}$ and high $V_{DS}$ defines a saturation region 15 of operation for the RF amplifying device. By configuring the load for the RF amplifying device and biasing the RF amplifying device so that its conduction channel characteristics remain on optimal load line 14, the RF amplifying device may do a respectable job of linear amplification. Operation in saturation region 15 is consistent with amplification class A, class B, class AB, and variants thereof. In saturation region 15, the amplification operation remains insensitive to modulation of $V_{DS}$. In other words, $V_{DS}$ needs to meet a minimum level associated with $V_{knee}$, but may be greater than this minimum level up to a point where $V_{breakdown}$ is reached. This insensitivity provides the underlying characteristic that allows envelope tracking (ET) biasing techniques to roughly or closely track an envelope for an RF communication signal being amplified and achieve power-added efficiency (PAE) improvements. When the envelope indicates there is no need for a higher $V_{DS}$, $V_{DS}$ may be lowered to reduce power consumption without significantly impacting linearity because in saturation region 15 amplification is insensitive to modulation in $V_{DS}$. And, as depicted in FIG. 1, $V_{knee}$ becomes reduced as the peak VGS is reduced due to a reducing envelope.

In contrast, a triode region 17 exists at $V_{DS}$ voltages less than $V_{knee}$. In triode region 17, amplification exhibits a marked sensitivity to modulation of $V_{DS}$ as well as modulation of $V_{GS}$. Operation in triode region 17 is consistent with amplification classes C-E, and variants thereof. Triode region 17 is useful for an envelope elimination and restoration (EER) biasing technique, which is also called polar amplification. In accordance with EER biasing, a class C-E switching amplifier may be used to amplify phase information after the envelope information has been eliminated, and the marked sensitivity to $V_{DS}$ modulation may be exploited to restore the envelope to the amplified phase information.

The respectably linear job of amplification that may result from operation in saturation region 15 may nevertheless be improved through predistortion and other linearization techniques which take place outside the RF amplifying device itself. But if the RF amplifying device is allowed to operate at a $V_{DS}$ less than $V_{knee}$ and/or a $V_{DS}$ greater than $V_{breakdown}$, then the amplification operation becomes characterized by a substantial degree of nonlinearity. Conventional linearization techniques may have little or no ability to compensate for this substantial degree of nonlinearity, so operation beyond the $V_{knee}$ and $V_{breakdown}$ points is desirably avoided.

Power-added efficiency (PAE) improves by biasing the RF amplifying device so that the amplified RF waveform traverses the entirety of optimal load line 14 during each cycle of the RF waveform. In order to optimize both linearity and PAE, the RF amplifying device should operate over the entirety of optimal load line 14, and refrain from operating beyond the ends of optimal load line 14. When the envelope or magnitude of the RF signal being amplified changes, then biasing signals may correspondingly change so that the RF waveform at the changed envelope level continues to traverse the entirety of optimal load line 14 for the changed biasing scenario to achieve a desirably high PAE, and only traverse load line 14 to support linearity. This changing of the bias signals to track the envelope and raise PAE is the goal of envelope tracking (ET), envelope elimination and restoration (EER) and hybrid techniques of RF amplifier biasing. FIG. 1 depicts optimal load line 14 for a maximum envelope condition. FIG. 1 also depicts optimal load line 14' for a reduced envelope condition. Optimal load line 14' is parallel to optimal load line 14, but displaced to the left to accommodate a reduced range of $V_{GS}$ and $V_{DS}$. PAE improvements result from moving optimal load line 14' to traverse a lower range of $V_{DS}$ and from moving optimal load line 14' to take advantage of a reduced $V_{knee}$ for a reduced $V_{GS}$.

Even when operating the RF amplifying device within the confines of optimal load lines 14 and 14', the amplifying operation may be imperfectly linear. Imperfect linearity may cause the RF amplifying device to generate harmonics of the fundamental RF communication signal being amplified. The RF amplifying device may even exhibit a significant square-law dependence on $V_{GS}$ in addition to a linear dependence, leading to one form of distortion. And, the use of a time-varying biasing signal in accordance with an ET biasing scheme may generate another form of sub-RF distortion.

Figure 2:
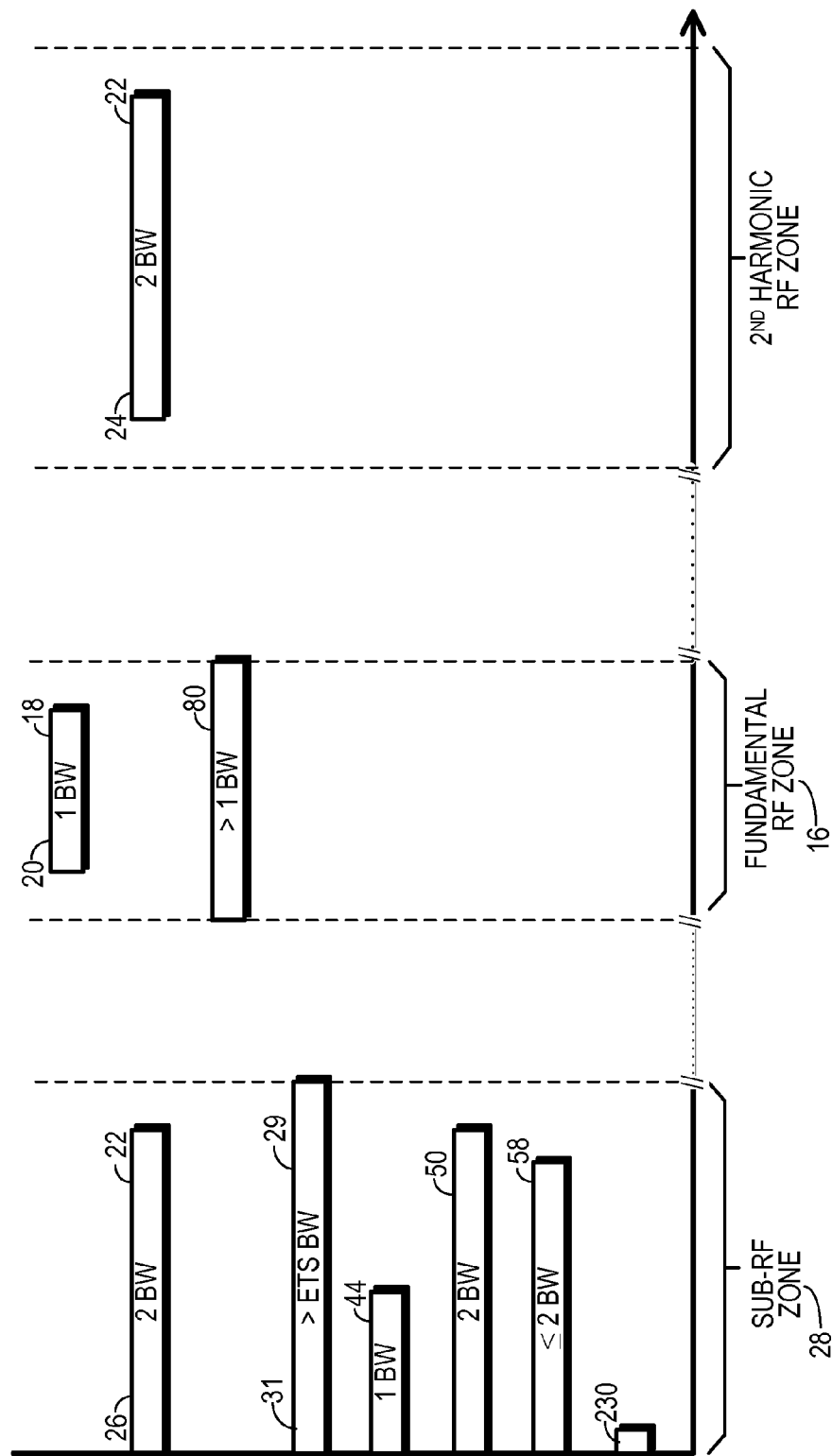
FIG. 2 shows a chart of three different zones of the electromagnetic spectrum and of relative bandwidths of signals discussed in connection with FIGS. 1-5.

FIG. 2 shows a chart of three different zones of the electromagnetic spectrum and of relative bandwidths of signals discussed in connection with FIGS. 1-5. A fundamental RF zone 16 represents one of these three zones. Fundamental RF zone 16 is the portion of the electromagnetic spectrum where a transmitter that employs the RF amplifying device is designed and/or authorized to operate. The transmitter may transmit at a full authorized power within and throughout a single fundamental bandwidth 18 located in fundamental RF zone 16. But to the extent that the RF amplifying device is imperfectly linear and/or exhibits a square-law dependence on $V_{GS}$, harmonics of a fundamental RF signal 20 will be generated. While any number of harmonics in varying degrees of strength may be generated as a byproduct of the amplification process, a second harmonic 22 may be the most prominent. Second harmonic 22 represents unwanted energy or distortion in the amplified signal. The second harmonic is responsible for a second harmonic distortion signal 24 and a sub-RF, amplifier generated distortion signal 26. Second harmonic distortion signal 24 is located at twice the frequency of fundamental bandwidth 18 and exhibits roughly twice the bandwidth of fundamental bandwidth 18. Sub-RF amplifier-generated distortion signal 26 extends upward in frequency from zero Hz for two or more spans of fundamental bandwidth 18 but not so far as to reach fundamental RF zone 16. Sub-RF distortion signal 26 resides in a sub-RF zone 28 of the electromagnetic spectrum that extends upward from zero Hz for a range of a few spans, and desirably at least two spans, of single bandwidth 18. As a result of amplifying an RF communication signal supplied to an input of the RF power amplifier, the RF amplifying device generates an amplified signal that is a composite of at least fundamental RF signal 20 second harmonic distortion signal 24, and sub-RF distortion signal 26. To the extent that even ordered harmonics greater than the second harmonic (i.e., fourth, sixth, etc.) are present, they will also have associated sub-RF components that reside in sub-RF zone 28.

Apart from sub-RF distortion signal 26, a time-varying bias signal (not shown) may exhibit a bandwidth confined within sub-RF zone 28. The time-varying bias signal may be amplified by an envelope amplifier, then passed through a bias feed network that includes at least an in-series RF choke, to a conduction channel node of the RF amplifying device. Due to the frequency-dependent impedance of the bias feed network, and particularly the RF choke, in conjunction with the conductivity of the RF amplifying device, the bias signal which appears at the conduction channel node of the RF amplifying device may fail to match the time-varying bias signal applied to the envelope amplifier. A bias-generated distortion signal 29 represents the amount by which the bias signal which appears at the conduction channel node of the RF amplifying device fails to match the time-varying bias signal applied at the input to the envelope amplifier. Bias-generated distortion signal 29 occupies a bandwidth 31 which also resides in sub-RF zone 28.

Second harmonic distortion signal 24 may be removed or otherwise controlled using filtering, RF traps, and/or other techniques known to those of skill in the art. But amplifier-generated sub-RF distortion signal 26 is at least close to the frequency of the bias signals generated for and supplied to the RF amplifying device and may fall squarely in the same bandwidth as bias signals. Likewise, bias-generated sub-RF distortion signal 29 falls in the same sub-RF zone 28 of the spectrum. Thus, sub-RF distortion signals 26 and 29 may individually and collectively act like an unwanted bias signal or like bias distortion or corruption. Sub-RF distortion signals 26 and 29 destabilize a bias signal target desired for the RF amplifying device by adding to or being subtracted from the bias signal target. As depicted by right and left extending horizontal arrows in FIG. 1, sub-RF distortion signals 26 and 29 alter $V_{DS}$ by being added to and subtracted from $V_{DS}$. As a result of the influence of sub-RF distortion signals 26 and 29 on $V_{DS}$, if the RF amplifying device operates on optimal load lines 14 and 14', significant nonlinearity will result because sub-RF distortion signals 26 and 29 will often push $V_{DS}$ below $V_{knee}$ and possibly above $V_{breakdown}$.

In order to avoid this significant nonlinearity, the RF amplifying device may be operated on a sub-optimal load line 30 (FIG. 1), shown for a peak power condition. At sub-optimal load line 30, in spite of the fluctuation or instability of $V_{DS}$ in response to the sub-RF distortion signals 26 and 29, the amplification operation of the RF amplifying device remains substantially linear and substantially insensitive to modulation of $V_{DS}$. But sub-optimal load line 30 detunes the RF amplifying device away from optimal PAE performance to avoid significant nonlinearity. As the amplified signal generated by the RF amplifying device contains a higher proportion of second and higher even-ordered harmonics and as bias-generated distortion signal 29 becomes more significant, the more sub-optimal load line 30 must be detuned away from optimal PAE performance. Even small amounts of such detuning may have an exaggerated effect in terms of power because power is related to the square of voltage and current. Accordingly, it is desirable to limit the amount of such detuning.

Figure 3:
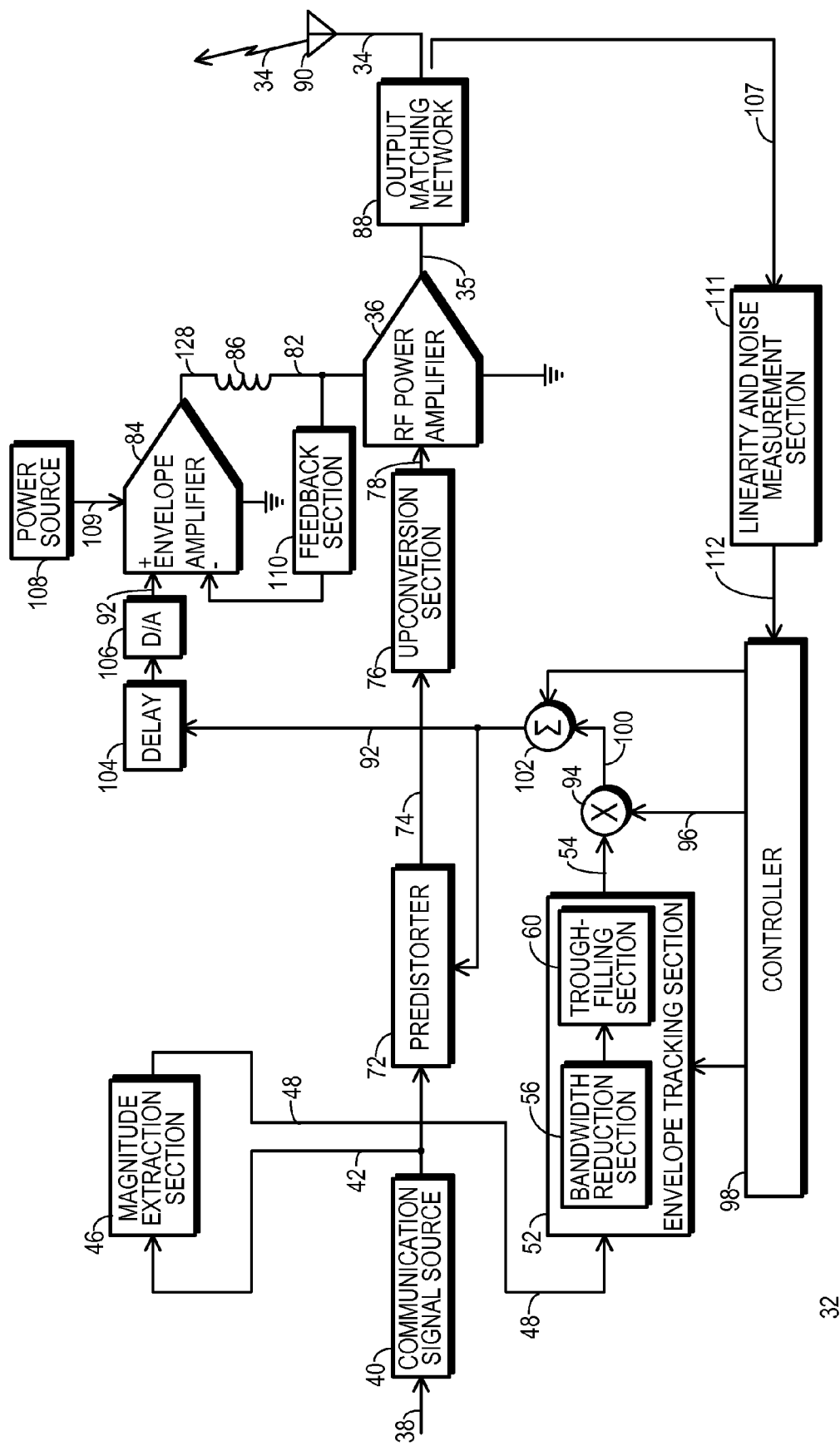
FIG. 3 shows a simplified block diagram of a transmitter configured in accordance with one embodiment of the present invention.
Figure 4:
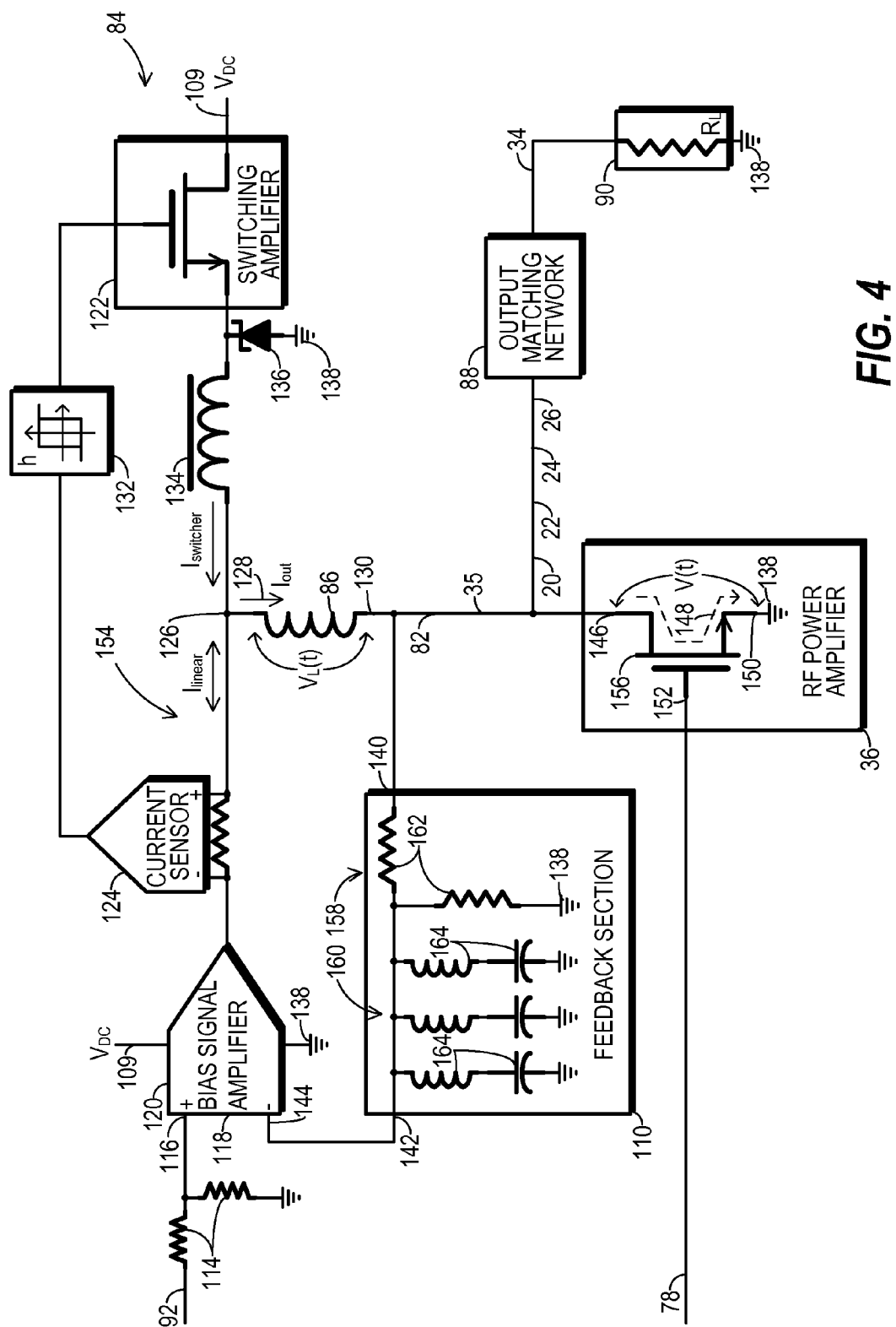
FIG. 4 shows a simplified block diagram of one embodiment of RF and biasing sections used by the transmitter.
Figure 5:
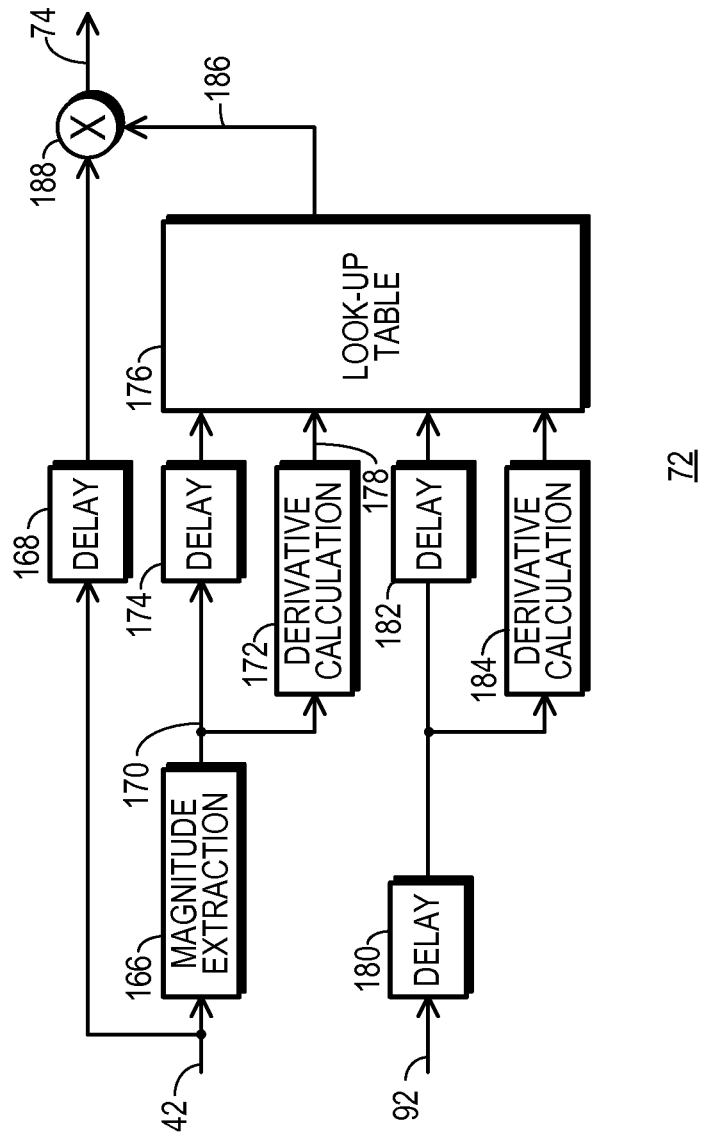
FIG. 5 shows a simplified block diagram of one embodiment of a predistorter portion of the transmitter.

FIGS. 3-5 describe an alternate approach which reduces the influence of sub-RF distortion signals 26 and 29 on $V_{DS}$ to permit linear operation of the RF amplifying device closer to optimal load lines 14 and 14' (FIG. 1) than sub-optimal load line 30. FIG. 3 shows a simplified block diagram of a transmitter 32 configured in accordance with one embodiment of the present invention. In the embodiment explicitly depicted in FIG. 3, transmitter 32 is configured to wirelessly transmit an amplified RF communication signal 34. Transmitter 32 is configured to employ a linear, envelope tracking (ET), RF power amplifier 36, which is discussed in more detail below in connection with FIGS. 4 and 7.

Upstream of RF power amplifier 36, transmitter 32 receives one or more user data streams 38 at an input to a communication signal source 40. Communication signal source 40 provides a digitally modulated, baseband, complex version of a communication signal 42. For the purposes of this discussion, any "communication signal", such as communication signal 42 and others discussed below, is an electronic signal that may undergo a variety of different processing stages and be represented in a variety of different ways, including as one or more digital streams of data or as one or more analog signals. A communication signal has been modulated with information and/or data provided by user data stream(s) 38. The transmission of this information and/or data is the primary purpose of transmitter 32, and a communication signal could be demodulated or otherwise processed to recover the information and/or data. While a communication signal may have experienced a wide variety of processing stages, such stages have not destroyed or removed the information and/or data conveyed in amplitude and phase so that such information and/or data would be unrecoverable.

Communication signal source 40 may perform any number of activities well known to those skilled in the art of digital transmitters. For example, user data stream 38 may be digitally modulated using a suitable form of digital modulation, such as QPSK, CDMA, OFDM, or the like. Multiple data streams 38 may have been digitally modulated and combined together for transmission, as is common in a cellular base station, or a single data stream 38 may have been digitally modulated for transmission, as is common in an end-user's wireless device, such as a cell phone, touchpad, laptop, netbook, electronic book reader, wireless network adapter, wireless router, and the like. The digitally modulated signal may have been pulse shaped to limit bandwidth while minimizing intersymbol interference (ISI). Some of the processing performed by communication signal source 40 may inflate the peaks of the communication signal compared to what the peaks might have otherwise been. But communication signal source 40 may also include processing circuits to reduce the peaks or otherwise reduce the peak-to-average power ratio (PAPR) of baseband communication signal 42. Any or all of these and other types of signal processing activities conventionally employed on baseband digital communication signals may be performed at communication signal source 40.

As a result of the processing performed at communication signal source 40, communication signal 42 is a baseband, digitally modulated, complex signal that exhibits a bandwidth 44 (FIG. 2) less than or roughly equal to the span of bandwidth 18 allocated to transmitter 32 for the transmission of RF energy. Bandwidths 18 and 44 are typically set by a governmental agency which controls licensing of the electromagnetic spectrum and devices that use the spectrum. For communication signal 42, bandwidth 44 resides at baseband (i.e., near DC) in the lower half of sub-RF zone 28 (FIG. 2). Desirably, communication signal 42 is an analytic signal having a bandwidth centered at or near 0 Hz.

In accordance with one embodiment of the present invention, transmitter 32 is configured to implement an envelope tracking (ET), envelope elimination and restoration (EER), or hybrid technique (HET) for biasing a conduction channel of RF power amplifier 36 using a time-varying bias signal that loosely, closely, or almost identically follows an envelope of the RF communication signal. In order to form an envelope tracking signal suitable for use in connection with such biasing techniques, baseband communication signal 42 drives a magnitude extraction section 46. Magnitude extraction section 46 extracts a magnitude signal 48 from baseband communication signal 42. In other words, magnitude signal 48 describes the magnitude portion of the digital, baseband, complex form of the communication signal and describes no phase information. Magnitude signal 48 exhibits a double bandwidth 50 (FIG. 2), where baseband communication signal 42 exhibits a single bandwidth 44 (FIG. 2). Magnitude signal 48 also substantially describes the envelope of amplified RF communication signal 34 amplified by RF power amplifier 36 and broadcast from transmitter 32. Magnitude signal 48 drives an input to an envelope tracking section 52, which generates a raw envelope tracking signal 54.

In one embodiment, magnitude signal 48 may, without further processing, serve as raw envelope tracking signal 54, which will be scaled and offset before being used to control a bias signal generated for RF power amplifier 36. In such an embodiment, an optional bandwidth reduction section 56, which is a portion of an envelope tracking section 52, is omitted and raw envelope tracking signal 54 will desirably exhibit double bandwidth 50 (FIG. 2). Such an embodiment is useful when an EER technique is being used to bias RF power amplifier 36. Such an embodiment may also be useful when a hybrid between and EER and ET techniques is being used to bias RF power amplifier 36. In these situations the bias signal being generated for RF power amplifier 36 will closely or almost identically follow magnitude signal 48 and the envelope of RF communication signal 34. A very high PAE may be achieved in these situations.

In another embodiment, bandwidth reduction section 56 is included in envelope tracking section 52, and an output of magnitude extraction section 46 couples to an input of bandwidth reduction section 56. Bandwidth reduction section 56 processes magnitude signal 48 to reduce its bandwidth. The reduced-bandwidth signal generated by bandwidth reduction section 56 may directly serve as raw envelope tracking signal 54, or may be detroughed first. The reduced bandwidth signal exhibits an envelope tracking bandwidth 58 (FIG. 2). Envelope tracking bandwidth 58 is less than or equal to double bandwidth 50 (FIG. 2) exhibited by magnitude signal 48, but the amount of bandwidth reduction is not critical for purposes of the present invention. In some embodiments, envelope tracking bandwidth 58 may exhibit a bandwidth less than single bandwidth 44. This embodiment may be useful when an ET technique or a hybrid between ET and EER techniques is being used to generate the bias signal for RF power amplifier 36. In such applications the bias signal being generated for RF power amplifier 36 will roughly follow magnitude signal 48 and the envelope of amplified RF communication signal 34. A high PAE may still be achieved in these situations; with higher PAE being more easily achievable the more closely raw envelope tracking signal 54 comes to tracking magnitude signal 48 and exhibiting double bandwidth 50.

The use of a reduced bandwidth form of raw envelope tracking signal 54 may be desirable for a couple of different reasons. First, a reduced-bandwidth 58 (FIG. 2) form of a biasing signal may be provided to RF power amplifier 36 by a less expensive and/or more efficient envelope amplifier (discussed below). Second, a reduced-bandwidth 58 form of the biasing signal may place fewer demands on the generation of predistortion.

Envelope tracking section 52 may generate raw envelope tracking signal 54 by following conventional techniques. One example of an envelope tracking section that reduces bandwidths and that may be used in transmitter 32 is described in U.S. Pat. No. 7,570,931, issued 4 Aug. 2009, and entitled "RF Transmitter With Variably Biased RF Power Amplifier And Method Therefor," and is incorporated by reference in its entirety herein. In general, any envelope tracking section directed toward the following three goals may be adequate for the purposes of transmitter 32. First, raw envelope tracking signal 54 should remain at an amplitude greater than or equal to the amplitude of magnitude signal 48 at substantially every sample. Second, raw envelope tracking signal 54 should remain at as low an amplitude as possible for as long as possible without violating the first goal, subject to de-troughing constraints discussed below. And third, raw envelope tracking signal 54 may exhibit a reduced bandwidth 58 sufficiently low that a practical and economical implementation of an envelope amplifier (discussed below) can track it and so that a practical and economical digital predistortion circuit (discussed below) may compensate for any distortion the biasing signal causes without violating the first and second goals, but no lower than necessary.

Magnitude signal 48, and/or a reduced bandwidth signal which tracks magnitude signal 48, may exhibit undesirably low troughs, which if used to generate an envelope-tracking bias signal could lead to gain collapse in RF power amplifier 36. Gain collapse is undesirable because it results in unwanted nonlinearity, spectral regrowth, and distortion. Moreover, these unwanted attributes cannot be effectively compensated using conventional predistortion techniques. Accordingly, a trough-filling section 60 is desirably included in envelope tracking section 52 to detrough raw envelope tracking signal 54. Trough-filling section 60 boosts the magnitude of any samples that fall below a threshold that is related to a threshold voltage $V_T$ for RF power amplifier 36. Desirably, the threshold is set so that $V_{DS} \geq V_{GS} + V_T$. Also, desirably, any magnitude boosting performed in trough-filling section 60 is performed in a manner that does not increase the bandwidth of raw envelope tracking signal 54 beyond envelope tracking bandwidth 58.

Baseband communication signal 42 generated by communication signal source 40 also drives a first input of a digital predistorter 72. Predistorter 72 intentionally distorts baseband communication signal 42, converting it into a complex, digital, predistorted baseband communication signal 74. An output of predistorter 72 couples to an input of an upconversion section 76. Predistorter 72 is discussed in more detail below in connection with FIG. 5.

Upconversion section 76 converts predistorted baseband communication signal 74 into a complex analog signal, mixes the analog signal with a pair of RF oscillation signals (not shown) in phase quadrature, and then combines and filters the resulting RF signals into an RF communication signal 78. RF communication signal 78 is positioned in fundamental RF zone 16 (FIG. 2) of the electromagnetic spectrum and roughly exhibits a bandwidth greater than bandwidth 44 (FIG. 2) due to bandwidth expansion occurring in predistorter 72. In addition to the communication signal, RF communication signal 78 desirably includes intentionally introduced distortion configured to compensate for distortions 80 (FIG. 2) in an amplified communication signal 35 directly generated by RF power amplifier 36. Distortions 80 are located in fundamental RF zone 16 and include unwanted intermodulations between signals located in sub-RF zone 28 (FIG. 2) and the wanted RF communication signal located in fundamental RF zone 16 (FIG. 2). The signals located in sub-RF zone 28 include sub-RF distortion signal 26 (FIG. 2) and bias-generated distortion signal 29 (FIG. 2) generated in response to raw envelope tracking signal 54.

RF communication signal 78 is provided to the input of RF power amplifier 36. At power amplifier 36, amplified communication signal 35 is generated in response to RF communication signal 78 and a stabilized bias signal 82 formed at a conduction node of RF power amplifier 36 when a pre-stabilized bias signal 128 is supplied by an envelope amplifier 84 through an RF choke 86. Either the same or a different conduction node of RF power amplifier 36 serves as an output of RF power amplifier 36. The output of RF power amplifier 36 couples to an output matching network 88, which blocks unwanted harmonics in amplified communication signal 35 and generates amplified RF communication signal 34. From output matching network 88, amplified RF communication signal 34 is transmitted to an antenna 90, from which amplified RF communication signal 34 is broadcast.

Stabilized bias signal 82, formed from pre-stabilized bias signal 128 supplied by envelope amplifier 84 through RF choke 86, is generated in response to a bias control signal 92 supplied to a positive differential input of envelope amplifier 84. Bias control signal 92 is also provided to a second input of predistorter 72. Bias control signal 92 is an enveloping tracking signal and the target bias signal that stabilized bias signal 82 desirably closely matches. It is formed from raw envelope tracking signal 54. In particular, raw envelope tracking signal 54 is supplied to a first input of a scaling section 94, and a control signal 96 from a controller 98 drives a second input of scaling section 94. A scaled envelope tracking signal 100 generated by scaling section 94 then drives a first input of an offset section 102, where a second input of offset section 102 is driven by a control signal 103 from controller 98. An output of offset section 102 generates bias control signal 92. Bias control signal 92 drives envelope amplifier 84, after delay in a delay element 104 and conversion into an analog signal in a digital-to-analog (D/A) converter 106. Delay element 104 is configured to temporally align stabilized bias signal 82 with RF communication 78 at RF power amplifier 36.

Other control signal outputs from controller 98 may be provided to envelope tracking section 52 for use in setting a threshold for use in boosting troughs in trough-filling section 60, adjusting bandwidth-limiting parameters for bandwidth reduction section 56, and the like.

Envelope amplifier 84 receives input power from a power source 108. Desirably, power source 108 provides a relatively constant DC voltage 109. Envelope amplifier 84 is configured to convert the input power from power source 108 into stabilized bias signal 82. A feedback section 110 senses a voltage signal at a node between RF choke 86 and RF power amplifier 36 and passes a portion of this voltage signal to a negative differential input of envelope amplifier 84 to form a control loop that causes stabilized bias signal 82 to closely track bias control signal 92. Power source 108 may be, but is not required to be, a battery. Preferred embodiments of envelope amplifier 84 which are useful in meeting the goals of transmitter 32 are discussed below in connection with FIGS. 4 and 7.

Amplified RF communication signal 34 is fed back to a linearity and noise measurement section 111 using a feedback signal 107. Measurement section 111 may down-convert and digitize feedback signal 107, then processes feedback signal 107 to generate metrics 112. Metrics 112 are applied to an input of controller 98. In response to metrics 112, controller 98 adjusts the control signals it supplies to scaling section 94 and offset section 102. Bias control signal 92 is continuously adjusted to maximize PAE for RF power amplifier 36 while operating transmitter 32 within limits imposed by a spectral mask. Preferably, controller 98 implements different dither control loops having considerably different and substantially uncorrelated dither sequences or having different bandwidths so that the different control loops are substantially independent from one another.

In one embodiment controller 98 monitors metrics 112 to focus upon out-of-band energy located just outside of RF fundamental bandwidth 18 (FIG. 2) in the electromagnetic spectrum. When controller 98 detects a signal level above the amount permitted by the relevant spectral mask for transmitter 32, action is taken to improve linearity. That action may be to adjust scale factors and offsets applied at scaling section 94 and offset section 102 to promote greater linearity. When controller 98 detects an out-of-band signal level below the spectral mask, opposite actions are taken to improve PAE. As a result, control parameters converge to values that maintain the out-of-band portion of amplified RF communication signal 34 at a substantially constant predetermined power level which complies with the spectral mask, but just barely complies.

FIG. 4 shows a simplified block diagram of one embodiment of RF and biasing sections used in transmitter 32. Bias control signal 92 output from D/A 106 (FIG. 3) in an analog form drives a resistive voltage divider 114 having a central tap coupled to a positive input 116 of a differential input section 118 of a bias signal amplifier 120. Relatively constant DC voltage 109 from power source 108 (FIG. 3) is provided to a power input of bias signal amplifier 120 and to a power input of a switching amplifier 122. An output of bias signal amplifier 120 couples to a first port of a current sensor 124, and a second port of current sensor 124 couples to a first node 126 of RF choke 86. A pre-stabilized, time-varying bias signal 128 is applied to RF choke 86 at first node 126, while a second node 130 of RF choke 86 supplies stabilized bias signal 82 to RF power amplifier 36. An output of current sensor 124 couples to an input of a hysteretic controller 132, and an output of hysteretic controller 132 couples to an input of switching amplifier 122. An output of switching amplifier 122 couples to a first node of a buck inductor 134, and a second node of buck inductor 134 couples to first node 126 of RF choke 86. A protection device 136, such as a Zener diode, couples between the output of switching amplifier 122 and a ground terminal 138 adapted to provide a common potential to protect switching amplifier 122 from high voltage spikes potentially generated by buck inductor 134.

Envelope amplifier 84 includes bias signal amplifier 120, current sensor 124, hysteretic controller 132, switching amplifier 122, buck inductor 134, and related components. The output of envelope amplifier 84 is available at first node 126 of RF choke 86. Envelope amplifier 84 includes two separate amplifiers which have different characteristics but which work together to provide both high power efficiency and a frequency response which desirably covers the entirety of sub-RF zone 28 (FIG. 2). Bias signal amplifier 120 is desirably configured as a highly agile, differential input, linear amplifier having a bandwidth covering the entirety of sub-RF zone 28. But such linear amplifiers tend to use power inefficiently. Switching amplifier 122 is desirably configured as a highly efficient switching amplifier, which forms a buck or boost converter when coupled with buck inductor 134. But such switching amplifiers tend to exhibit a low bandwidth dictated by the use of a buck inductor 134 having sufficiently high inductance to restrain voltage ripple. In the FIG. 4 embodiment, envelope amplifier 84 is a hybrid envelope amplifier which includes both a linear amplifier 120 and a switching amplifier 122 cooperatively coupled together.

Current sensor 124 and hysteretic controller 132 control the duty cycle for switching amplifier 122. The duty cycle is controlled so that switching amplifier 122, within the ability of its limited bandwidth, sources an amount of current which causes the current sourced by the highly agile bias signal amplifier 120 to decrease toward zero. In other words, switching amplifier 122 is controlled to supply as much of the current for pre-stabilized bias signal 128 as it can, leaving little or no current for bias signal amplifier 120 to source. As a result, the voltage at first node 126 of RF choke 86 is controlled by bias signal amplifier 120, but the current flowing through RF choke 86 is sourced by switching amplifier 122 to the ability of its limited bandwidth. The highly agile but inefficient bias signal amplifier 120 is primarily responsible for the higher frequency energy portion of pre-stabilized bias signal 128 and the low bandwidth, efficient switching amplifier 122 is primarily responsible for the lower frequency energy portion of pre-stabilized bias signal 128. Since the vast majority of the energy delivered by pre-stabilized bias signal 128 is lower frequency energy, the high efficiency of switching amplifier 122 prevails in the overall efficiency of envelope amplifier 84. But the highly agile bias signal amplifier 120 allows pre-stabilized bias signal 128 to exhibit a bandwidth corresponding to sub-RF zone 28.

Second node 130 of RF choke 86 couples to a first port 140 of feedback section 110, and a second port 142 of feedback section 110 couples to a negative input 144 of differential input section 118 of bias signal amplifier 120. Second node 130 of RF choke 86 also couples to a first node 146 of a conduction channel 148 of RF power amplifier 36. A second node 150 of conduction channel 148 of RF power amplifier 36 couples to ground terminal 138. RF communication signal 78 drives an input node 152 of RF power amplifier 36.

Stabilized bias signal 82 is generated at second node 130 of RF choke 86 through the operation of a control loop 154 that includes bias signal amplifier 20, RF choke 86, and feedback section 110. But RF power amplifier 36 exerts an influence over control loop 154 because stabilized bias signal 82 is applied at an output of a core amplifying device 156, represented in FIG. 4 using a field effect transistor (FET) symbol. FIG. 4 depicts first node 146 of conduction channel 148 as being the drain, second node 150 as being the source, and input node 152 as being the gate. Although not shown in FIG. 4, a suitable DC voltage may be used to bias the input of RF power amplifier 36.

Those skilled in the art will appreciate that a wide variety of n-channel or p-channel, short-channel or long-channel, FET amplifying devices, including MOS, CMOS, LDMOS, and the like, may be used as amplifying device 156 and that other types of transistor and tube forms of amplifying devices 156 may also be used. Moreover, while FIG. 4 shows only a single core amplifying device 156 for simplicity, RF power amplifier 36 may use multiple active devices coupled together to serve in the role of amplifying device 156. Examples of such multiple-device structures include a push-pull configuration commonly used for class AB operation, a stack commonly used with CMOS amplifying devices, and a driver stage followed by a final stage. These and other forms of RF power amplifier 36 are intended to be included in the scope of the present invention.

In the configuration depicted in FIG. 4, first conduction channel node 146 serves as the output for RF power amplifier 36, and first conduction channel node 146 couples to an input of output matching network 88. An output of output matching network 88 couples to antenna 90, depicted in FIG. 4 as a resistive load located between output matching network 88 and ground terminal 138. Those skilled in the art will appreciate that RF power amplifier 36 need not follow the simplified architecture depicted in FIG. 4 but that a wide variety of conventional and unconventional RF power amplification architectures may alternatively be used. For example, in a push-pull configuration, a second active device (not shown) may be located between second conductive channel node 150 and either ground terminal 138 or a negative potential. For this push-pull configuration, the output of RF power amplifier 36 may be provided by the junction between the two active devices at second conduction channel node 150, which would couple to output matching network 88.

FIG. 4 depicts the biasing network for conduction channel 148 to include only RF choke 86. Desirably envelope trapping capacitors are avoided as much as possible to reduce memory-effect nonlinearities. From first node 126 of RF choke 86, the output of bias signal amplifier 120 in series with current sensor 124 presents a low impedance to ground at frequencies throughout sub-RF zone 28 (FIG. 2) and throughout fundamental RF zone 16 (FIG. 2). RF choke 86 is desirably configured to substantially attenuate or block the flow of RF current in fundamental RF zone 16 while passing DC current and current at frequencies in sub-RF zone 28 with little or no attenuation.

Those skilled in the art will appreciate that an inductor may be configured to serve as an RF choke, such as RF choke 86. The configuration of an inductor to be an RF choke involves selection of an inductance value and arrangement in a circuit topology. The circuit topology arrangement isolates the low impedance output node of bias signal amplifier 120 from first conduction node 146 of RF power amplifier 36 for frequencies in fundamental RF zone 16. The inductance value selection allows as low of an impedance as possible throughout frequencies in sub-RF zone 28 while providing an impedance much higher than the impedance presented to RF power amplifier 36 by output matching network 88 at frequencies in fundamental RF zone 16. This circuit topology arrangement avoids substantial attenuation of amplified communication signal 34 at conduction node 146 of RF power amplifier 36.

RF communication signal 78 is amplified by RF power amplifier 36 to form amplified communication signal 35. Amplified communication signal 35 is a composite signal that includes the desired fundamental RF signal 20 (FIG. 2) along with distortion signals 24 and 26 (FIG. 2). Other harmonics may be present as well, but should be less prominent in amplified communication signal 35. As discussed above, while the second harmonic of RF communication signal 78 may be responsible for one form or component of amplifier-generated sub-RF distortion signal 26, bias-generated sub-RF distortion signal 29 (FIG. 2) may also be present. Accordingly, a time-varying voltage V(t) develops across conduction nodes 146 and 150 in response to the amplification operation of RF power amplifier 36 responding to RF communication signal 78, and this voltage V(t) characterizes at least sub-RF distortion signal 26 and fundamental RF signal 20. Voltage V(t) also characterizes biasing provided by envelope amplifier 84 through RF choke 86, including bias-generated distortion signal 29.

Control loop 154 is configured to cause the portion of voltage V(t) occupying at least envelope tracking bandwidth 58, and preferably occupying substantially all of sub-RF zone 28, to substantially match bias control signal 92. Those skilled in the art will appreciate that control loop 154 may not be able to hold the sub-RF zone 28 portion of voltage V(t) equal to bias control signal 92 with absolute precision due to loop bandwidth limitations and noise limitations, but the sub-RF zone 28 portion of voltage V(t) is desirably held as closely equal to bias control signal 92 as practical.

Control loop 154 causes the sub-RF zone 28 portion of voltage V(t) to substantially match bias control signal 92 due to feedback provided through feedback section 110. Generally, feedback section 110 passes only a portion of composite amplified communication signal 35 to negative differential input 144 of bias signal amplifier 120. In order to maintain high PAE, that portion is a very low power portion compared to the power of composite amplified communication signal 35. In addition to being a low power portion, that portion is the portion that resides in sub-RF zone 28. Accordingly, feedback section 110 includes an isolating section 158 and a filtering section 160. In the embodiment depicted in FIG. 4, isolating section 158 includes a resistive voltage divider 162 coupled between second node 130 of RF choke 86, which may also be viewed as being first conduction node 146 of RF power amplifier 36, and ground terminal 138. A central tap of resistive voltage divider 162 couples to an input of filtering section 160.

In a preferred embodiment, resistive voltage divider 162 is configured to exhibit substantially the same resistances as resistive voltage divider 114. In order to achieve a high PAE, resistive voltage divider 162 is desirably configured to exhibit an impedance to first conduction node 146 of RF power amplifier 36 that is substantially greater throughout fundamental RF zone 16 than the impedance presented by output matching network 88. And, throughout fundamental RF zone 16, the impedance presented to conduction node 146 by resistive voltage divider 162 is also desirably greater than the impedance presented through RF choke 86. Moreover, in order to achieve a high PAE, resistive voltage divider 162 is desirably configured to exhibit an impedance to first conduction node 146 of RF power amplifier 36 that is substantially greater throughout sub-RF zone 28 than the impedance presented through RF choke 86. And, throughout sub-RF zone 28, the impedance presented by resistive voltage divider 162 is also desirably greater than the impedance presented by output matching network 88. The relatively higher impedance presented by isolating section 158 to conduction node 146 throughout sub-RF and fundamental RF zones 28 and 16 allows power amplifier 36 to achieve a high PAE.

In the embodiment depicted in FIG. 4, filtering section 160 includes a plurality of resonant RF traps 164, each with series inductive and capacitive elements mutually tuned to provide as low of an impedance notch as practical to RF fundamental signal 20 (FIG. 2), the second harmonic, or higher harmonics. This embodiment is suited to very wideband communication signals in comparison to RF zone 16 (FIG. 2). Through the operation of filtering section 160, the RF fundamental signal 20 portion of composite amplified communication signal 35 becomes significantly attenuated so that sub-RF zone 28 signals dominate. In other words, filtering section 160 of feedback section 110 is configured to distinguish the sub-RF zone 28 portion of composite amplified communication signal 35 from the fundamental RF zone 16 portion of signal 35, and pass only the sub-RF zone 28 portion to an input of bias signal amplifier 120. Those skilled in the art will appreciate that other filtering elements, such as low pass filters may also be included in filtering section 160 as needed to enhance stability, and/or that a low pass filter may be adapted for use instead of the above-discussed RF traps 164 for many applications. But phase shift and delay for signals within envelope tracking bandwidth 58 (FIG. 2), and preferably within sub-RF zone 28, are desirably held to a minimum.

The sub-RF zone 28 signal provided at second port 142 of feedback section 110 is still a composite signal which includes at least two combined sub-RF zone 28 signals. One of these two sub-RF zone 28 signals is sub-RF amplifier-generated distortion signal 26 (FIG. 2). The other is bias-generated bias control signal 92, including bias-generated distortion signal 29. Through the operation of control loop 154, the output of bias signal amplifier 120 will seek the signal level that causes the voltage of stabilized bias signal 82, which is also the portion of voltage V(t) occupying sub-RF zone 28, to match the voltage of bias control signal 92. In other words, through the operation of control loop 154, bias signal amplifier 120 generates a sub-RF zone 28 signal which, after passing through RF choke 86, at least partially cancels amplifier-generated sub-RF distortion signal 26 and bias-generated sub-RF distortion signal 29.

Through the operation of control loop 154, the stabilization of stabilized bias signal 82 allows transmitter 32 (FIG. 3) to improve linearity because the reduction of sub-RF distortion signals 26 and/or 29 likewise reduces the distortion 80 in fundamental RF zone 16 caused by intermodulation between sub-RF distortion signals 26 and/or 29 and RF communication signal 78. This desirable improved linearity result can be achieved in an alternate embodiment where a DC signal may be applied to bias signal amplifier 120 instead of the bias control signal 92 shown in FIG. 4. But the use of a time-varying envelope tracking signal, such as bias control signal 92, also improves PAE over the PAE achievable with other ET, EER, and hybrid RF power amplifier biasing techniques. The PAE improvement is due to the attenuation of sub-RF distortion signals 26 and/or 29, which causes RF power amplifier 36 to operate linearly along a load line closer to optimal load lines 14 and 14' (FIG. 1).

When using a time-varying bias control signal 92, stabilized bias signal 82 remains a time-varying bias signal occupying sub-RF zone 28. Consequently, intermodulation between stabilized bias signal 82 and RF communication signal 78 may still occur due to imperfect linearity in RF power amplifier 36. For example, while some semiconductor technologies may achieve transfer curves 12 (FIG. 1) which have sharp $V_{knee}$ and $V_{breakdown}$ corners, as shown in FIG. 1, other technologies may achieve more gradually curved $V_{knee}$ and $V_{breakdown}$ corners. Operating near such gradually curved $V_{knee}$ and $V_{breakdown}$ corners can lead to less perfect linearity and more intermodulation. This intermodulation results in distortion signal 80 (FIG. 2) occupying fundamental RF zone 16. But distortion signal 80 may be compensated through the operation of predistorter 72 (FIG. 3).

Referring back to FIG. 3, different architectures known to those of skill in the art may be employed for predistorter 72 in transmitter 32. Desirably, the architecture of predistorter 72 is operated at a realistic sampling rate and otherwise configured to consume no more power than is necessary so that transmitter 32 is compatible with battery powered operation. But the sampling rate used for predistorter 72 is desirably greater than the sampling rates that process the communication signal upstream of predistorter 72 because predistorter 72 will expand the bandwidth of the baseband communication signal to roughly that of magnitude signal bandwidth 50 (FIG. 2) or higher.

One example of a predistorter 72 that may be suitable for use in transmitter 32 is described in U.S. Patent Pub. No. 2012/0106676 A1, dated 3 May 2012, entitled "Transmitter Linearized in Response to Signal Magnitude Derivative Parameter and Method Therefor," and assigned to the assignees hereof, which is incorporated by reference in its entirety herein. FIG. 5 shows a simplified block diagram of a predistorter 72 configured essentially in accordance with the teaching of U.S. Patent Pub. No. 2012/0106676 A1, but this specific embodiment is not a requirement in transmitter 32.

As shown in FIG. 5, complex, baseband communication signal 42 drives a magnitude extraction section 166 and a delay element 168. Magnitude extraction section 166 extracts magnitude from complex signal 42 to generate a magnitude signal 170 that drives a derivative calculation section 172 and a delay element 174. Outputs of delay element 174 and derivative calculation section 172 couple to address inputs of a look-up table 176. Delay element 174 delays magnitude signal 170 into synchronism with a magnitude derivative signal 178 generated by section 172 at the address inputs of look-up table 176.

As discussed above, stabilized bias signal 82 (FIGS. 3-4) is a time varying signal that tracks bias control signal 92. And, stabilized bias signal 82 intermodulates with the fundamental RF communication signal 78 to cause at least some of distortion 80 (FIG. 2). To compensate for this form of distortion, bias control signal 92 is delayed in a delay element 180, then applied through another delay element 182 to a separate address input of look-up table 176. In addition, bias control signal 92, after delay in delay element 180, drives a derivative calculation section 184. An output of derivative calculation section 184 couples to another address input of look-up table 176. Delay elements 180 and 182 delay bias control signal 92 into synchronism with magnitude signal 170 and magnitude derivative signal 178 at the address inputs of look-up table 176 and delay the derivative with respect to time of bias control signal 92 into synchronism as well. Based on the four magnitude signal 170, magnitude derivative signal 178, bias control signal 92 and bias control signal derivative inputs to look-up table 176, look-up table 176 determines, on a sample by sample basis, a gain factor 186 by which baseband communication signal 42 should be scaled to appropriately predistort it so that RF power amplifier 36 will apply an inversing distortion 80 (FIG. 2) and cause amplified communication signal 35 (FIGS. 3-4) to appear as a more nearly linearly amplified signal. Thus, gain factor 186 drives a first input of a scaling section 188, and baseband communication signal 42, after being delayed in delay element 168, drives a second input of scaling section 188. Delay element 168 delays communication signal 42 into synchronism with gain factor 186. Scaling section 188 generates predistorted, baseband communication signal 74.

Although not shown, additional circuits may be provided which are responsive to communication signal 42 and to amplified RF communication signal 34 and which cause look-up table 176 to continuously adapt itself toward improving its ability to compensate for nonlinearity of RF power amplifier 10. U.S. Patent Pub. No. 2012/0106676 A1 discusses such adaptation circuits in more detail. Through the operation of predistorter 72, in which look-up table 176 has table address inputs responsive to both bias control signal 92 and the derivative of bias control signal 92, distortion 80, which is at least partially caused by the use of a time-varying, stabilized bias control signal 82, is at least partially cancelled.

Figure 6:
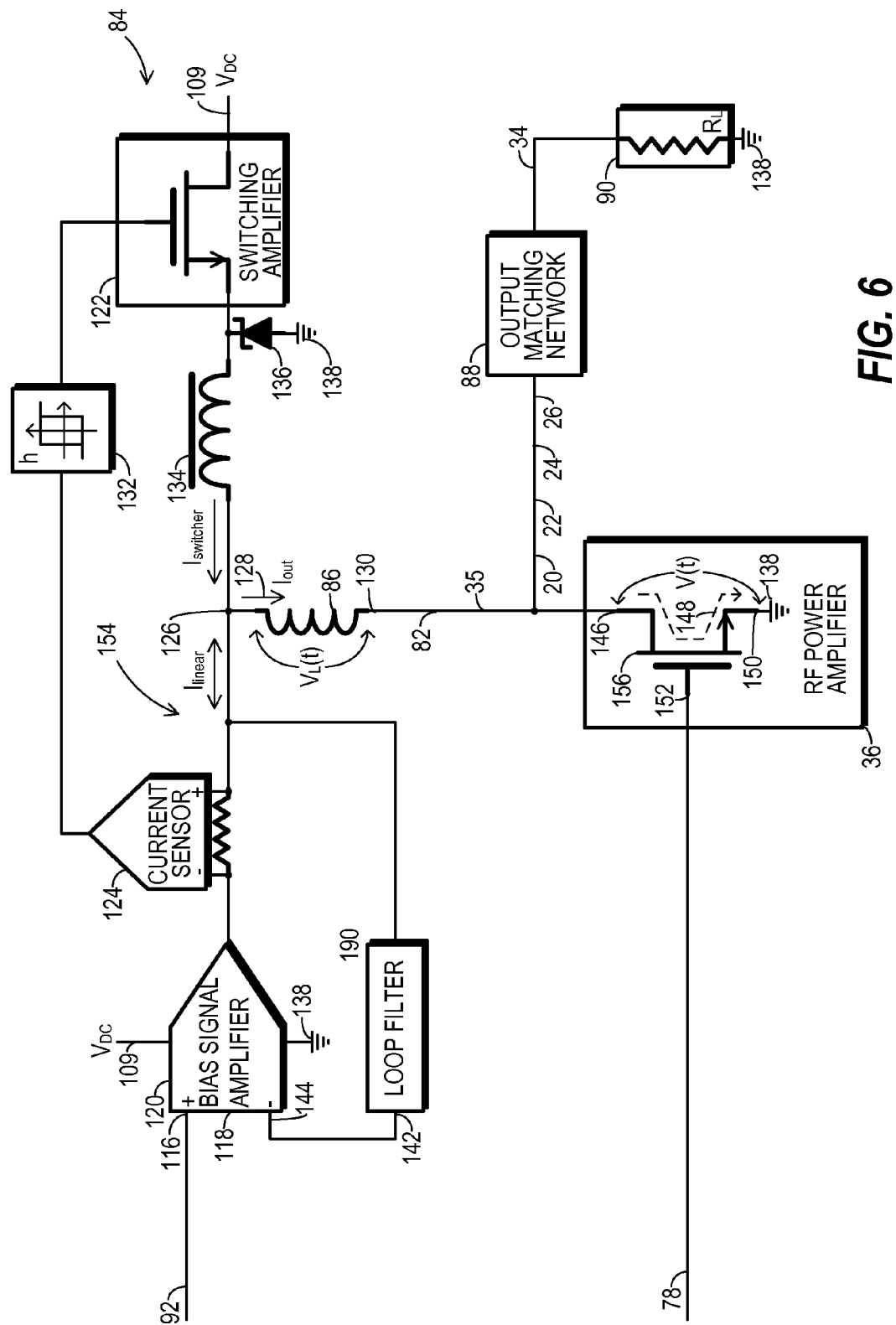
FIG. 6 shows a simplified block diagram of another embodiment of RF and biasing sections used by the transmitter.

FIG. 6 shows a simplified block diagram of another embodiment of RF and biasing sections used by transmitter 32. The FIG. 6 embodiment is similar to the FIG. 4 embodiment. In this FIG. 6 embodiment, as in the FIG. 4 embodiment discussed above, envelope amplifier 84 includes differential-input bias signal amplifier 120 configured as a linear amplifier and switching amplifier 122 which couples to bias signal amplifier 120 through buck inductor 134. Bias control signal 92 is applied to positive input 116 of differential input section 118 of bias signal amplifier 120. The output of envelope amplifier 84 is again provided at first node 126 of RF choke 86. Bias signal amplifier 120 exhibits a higher bandwidth than is exhibited by switching amplifier 122. And, bias signal amplifier 120 desirably exhibits a bandwidth covering the entirety of sub-RF zone 28 (FIG. 2). Likewise, RF power amplifier 36, RF choke 86, output matching network 88, and antenna 90 may all be configured substantially as described above in connection with FIG. 4. A suitable DC voltage may be used to bias the input of RF power amplifier 36, or in another embodiment a second hybrid envelope amplifier as shown in FIG. 4 may be driven by a magnitude signal, and preferably magnitude squared, to both bias the input of RF amplifier 36 and inject a baseband signal configured to at least partially cancel sub-RF distortion signal 26.

But the FIG. 6 embodiment differs from the FIG. 4 embodiment by feeding back pre-stabilized bias signal 128 from the output of envelope amplifier 84 and first node 126 of RF choke 86 through a loop filter 190 to negative input 144 in differential input section 118 of bias signal amplifier 120 rather than feeding back stabilized bias signal 82. Loop filter 190 may be configured to meet noise and stability considerations. Consequently, this FIG. 6 embodiment causes pre-stabilized bias signal 128 to closely match bias control signal 92. Moreover, amplifier-generated distortion signal 26 (FIG. 2) and/or bias-generated distortion signal 29 (FIG. 2) are fully developed across RF choke 86 and alter stabilized bias signal 82 compared to pre-stabilized bias signal 128.

Compared to the FIG. 4 embodiment, this FIG. 6 embodiment may appear to include unwanted sub-RF distortions 26 and/or 29 in stabilized bias signal 128, and to include such unwanted distortions to a larger extent than the FIG. 4 embodiment. But the FIG. 4 embodiment may nevertheless include a residual level of unwanted sub-RF distortions 26 and/or 29 to some extent due to noise and loop bandwidth limitations in the operation of control loop 154. In accordance with either the FIG. 4 or the FIG. 6 embodiment, transmitter 32 may be configured to predistort bias control signal 92 so that sub-RF distortions 26 and/or 29 essentially cancel and are cancelled by the bias signal predistortion, causing stabilized bias signal 82 to more closely resemble a target bias signal which does not include the predistortion. In other words, an intentionally distorted bias signal is fed to and generated by envelope amplifier 84, then passed through RF choke 86 to conduction channel node 146 of RF power amplifier 36. But due to distortion signals 26 and/or 29, the intentionally distorted bias signal is oppositely distorted to cancel distortion signals 26 and/or 29.

Figure 7:
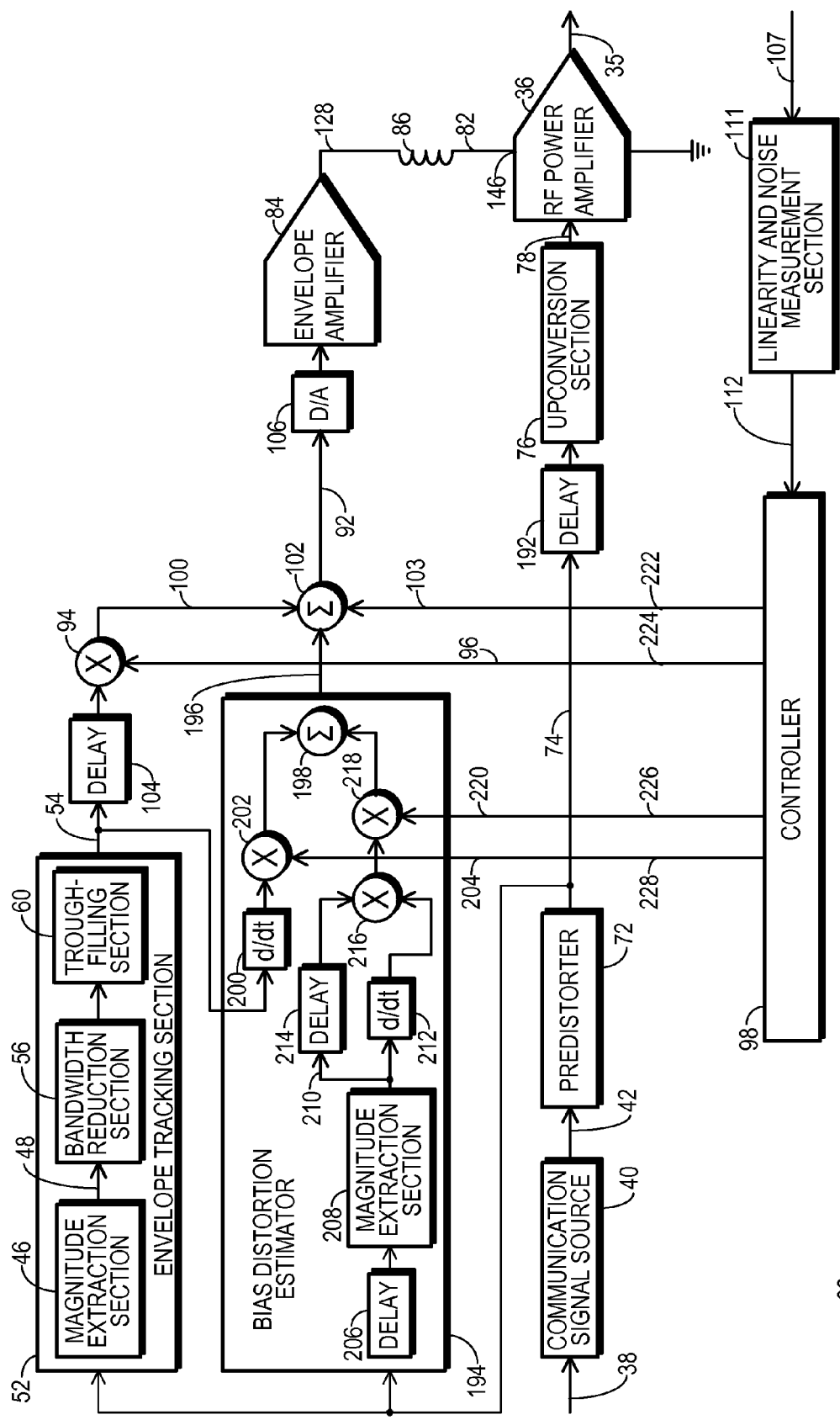
FIG. 7 shows a simplified block diagram of a transmitter configured in accordance with another embodiment of the present invention.

FIG. 7 shows a simplified block diagram of an embodiment of transmitter 32 which intentionally predistorts the bias signal applied to envelope amplifier 84. The FIG. 7 embodiment has many similarities with the FIG. 3 embodiment. Communication signal source 40 and predistorter 72 may be configured similarly to the FIG. 3 embodiment. In particular, the predistortion of predistorter 72 is applied to the baseband communication signal prior to upconversion and application to RF power amplifier 36. By way of contrast, a different form of predistortion is applied to a bias signal rather than a communication signal and separately fed to RF power amplifier 36 for purposes of amplifier biasing, as described below. Predistorted baseband complex communication signal 74 output from predistorter 72 may drive upconversion section 76 and RF power amplifier 36 as described above. For time alignment purposes with a bias signal being generated for envelope amplifier 84, predistorted baseband complex communication signal 74 may be delayed in a delay element 192 prior to application at upconversion section 76. Output matching network 88 and antenna 90 (not shown) may be included as shown in FIG. 3, but are omitted in FIG. 7 for convenience. Likewise, as in FIG. 3 feedback signal 107 conveys a small portion of amplified communication signal 34 (FIG. 3) to linearity and noise measurement section 111, which generates metrics 112 for controller 98.

As in FIG. 3, this FIG. 7 embodiment of transmitter 32 includes an envelope tracking section 52 configured as described above in connection with FIG. 3 and including bandwidth reduction section 56 and trough-filling section 60. But FIG. 7 depicts magnitude extraction section 46 as being included in envelope tracking section 52. In this FIG. 7 embodiment, magnitude extraction section 46 and envelope tracking section 52 are driven by predistorted, baseband, complex communication signal 74 rather than baseband complex communication signal 42, but predistorter 72 may, for some applications, be omitted so that magnitude extraction section 46 would then again be driven by baseband complex communication signal 42. Either way, envelope tracking section 52 is driven by a baseband communication signal that is also used to form RF communication signal 78.

Envelope tracking section 52 generates raw envelope tracking signal 54. As in the FIG. 3 embodiment, a delayed function of raw envelope tracking signal 54 is scaled in scaling section 94 by control signal 96 generated by controller 98 to produce scaled envelope tracking signal 100. Scaled envelope tracking signal 100 is then offset in offset section 102 by an amount determined by a control loop managed by controller 98 and expressed in a control signal 103. Raw envelope tracking signal 54 is delayed in delay element 104 to form a delayed function of envelope tracking signal 100 and to achieve time alignment between stabilized bias signal 82 and RF communication signal 78 at RF power amplifier 36. As in the FIG. 3 embodiment, offset section 102 generates bias control signal 92, which is converted into an analog version of bias control signal 92 at digital-to-analog (D/A) converter 106. The analog version of bias control signal 92 is passed to envelope amplifier 84. FIG. 7 depicts envelope amplifier 84 configured as discussed above in connection with FIG. 6. But a FIG. 4 embodiment of envelope amplifier 84 may used as well. Pre-stabilized bias signal 128 is provided by envelope amplifier 84, and passes through RF choke 86 to conduction channel node 146 of RF power amplifier 36, where it is altered into stabilized bias signal 82.

This FIG. 7 embodiment of transmitter 32 differs from the above-discussed FIG. 3 embodiment by the inclusion of a bias distortion estimator 194. Bias distortion estimator 194 is configured to form a bias stabilization signal 196 which is merged into scaled envelope tracking signal 100 at offset section 102. Offset section 102 is referred to below as merging section 102 since it serves to merge bias stabilization signal 196 into scaled envelope tracking signal 100. Moreover, scaled envelope tracking signal 100 represents the target or desired bias signal that stabilized bias signal 82 should match after alteration by sub-RF distortion signals 26 and/or 29. Hence, scaled envelope tracking signal 100 is also referred to below as target bias signal 100. And, in one embodiment a constant value (not shown) may be substituted for raw envelope tracking signal 54 at scaling section 94. Thus, scaling section 94 is also referred to below as target bias signal generator 94. After the merging operation of merging section 102, bias control signal 92 has been distorted away from target bias signal 100 in a manner configured to cancel and be cancelled by sub-RF distortion signals 26 and/or 29 after passing through envelope amplifier 84 and RF choke 86. Accordingly, bias control signal 92 is also referred to below as predistorted bias signal 92.

Bias distortion estimator 194 includes two paths which are combined together at a combiner 198. Combiner 198 produces bias stabilization signal 196. A first path forms a predistortion component directed toward canceling bias-generated distortion signal 29 (FIG. 2) in stabilized bias signal 82, and a second path forms a predistortion component directed toward canceling amplifier-generated distortion signal 26 (FIG. 2).

For the first path, raw envelope tracking signal 54 is supplied to an input of a differentiator 200. Differentiator 200 performs a mathematical differentiation with respect to time operation on envelope tracking signal 54, and its derivative output is supplied to a first input of a scaling section 202. A second input of scaling section 202 receives a control signal 204 from controller 98. Scaling section 202 performs a multiplication mathematical operation to scale the derivative from differentiator 200. The now scaled derivative from scaling section 202 is provided to a first input of combiner 198.

The purpose of this first path may be better appreciated by noting that the voltage of pre-stabilized bias signal 128 must equal the voltage $V_L(t)$ across RF choke 86 plus the voltage of stabilized bias signal 82, where the voltage of stabilized bias signal 82 equals the voltage across conduction channel 148 (FIGS. 4 and 6) of RF power amplifier 36. Referring to FIG. 1, the voltage across conduction channel 148 is denoted as $V_{DS}$. Substantially all sub-RF zone 28 (FIG. 2) current flowing through conduction channel 148 (denoted as $I_{DS}$ in FIG. 1) also flows through RF choke 86. Since RF choke 86 is an inductor, within sub-RF zone 28 voltage $V_L(t)$ across RF choke 86 is proportional to the inductance of RF choke 86 and the derivative with respect to time of $I_{DS}$. Assuming that RF power amplifier 36 operates only in its saturation region 15 (FIG. 1), it is noted that each transfer curve 12 has a similar slope. In other words, for linear operation in saturation region 15, current $I_{DS}$ is proportional to $V_{DS}$, and the proportion remains fairly constant throughout the different levels of $V_{GS}$. Since $I_{DS}$ flows through RF choke 86 and since voltage $V_{DS}$ is proportional to current for linear operation, then voltage $V_L(t)$ across RF choke 86 is also proportional to the derivative with respect to time of $V_{DS}$ for linear operation. As discussed above, it is desirable for $V_{DS}$ to be stabilized at and be equal to the voltage of target bias signal 100 in order to improve PAE and linearity. Thus, bias stabilization signal 196 includes a component that is proportional to the derivative of target bias signal 100. And, the proportion is substantially influenced by the inductance value of RF choke 86 and is characterized by control signal 204.

For the second path through bias distortion estimator 194, predistorted, baseband, complex communication signal 74, from which RF communication signal 78 is also formed, is fed through a delay element 206 to a magnitude extraction section 208. Delay element 206 is configured to delay the signal through this second path into synchronism with the signal propagating through the first path at combiner 198. Magnitude extraction section 208 extracts a magnitude signal 210 from baseband complex communication signal 74. Magnitude signal 210 is fed to an input of a differentiator 212 and also fed through a delay element 214 to a first input of a multiplier 216. Magnitude extraction section 208 may be configured similarly to magnitude extraction section 46, and in some applications magnitude signal 48 generated by magnitude extraction section 46 may be appropriately delayed and substituted for magnitude signal 210. Differentiator 212 performs a mathematical differentiation with respect to time operation on magnitude signal 210, and its derivative output is supplied to a second input of multiplier 216. Delay element 214 forms a delayed function of magnitude signal 210, which is delayed into synchronism with the derivative signal output from differentiator 212 at multiplier 216. An output from multiplier 216 drives a first input of a scaling section 218. A second input of scaling section 218 receives a control signal 220 from controller 98. Scaling section 218 performs a multiplication mathematical operation to scale the product from multiplier 216. The now scaled product from scaling section 218 is provided to a second input of combiner 198.

The second path is provided to generate a bias predistortion component directed toward canceling amplifier-generated distortion signal 26, which resides in sub-RF zone 28 (FIG. 2). The purpose of this second path through bias distortion estimator 194 may be better appreciated by recalling that in sub-RF zone 28 the voltage $V_L(t)$ across RF choke 86 is proportional to the inductance of RF choke 86 and the derivative with respect to time of current $I_{DS}$. But for amplifier-generated distortion signal 26, current $I_{DS}$ is a function of magnitude, and more precisely roughly proportional to magnitude squared because amplifier-generated distortion signal 26 is a byproduct of second harmonic 22 (FIG. 2). The voltage $V_L(t)$ across RF choke 86 is proportional to the derivative of a composite function of current $I_{DS}$, which itself is a function of magnitude. Following the chain rule for determining derivatives, the derivative of a composite function is roughly the derivative of the outer function times the derivative of the inner function. The derivative of the inner function (magnitude-squared) is proportional to two times magnitude, and the derivative of the outer function is proportional to the derivative of magnitude. Hence, the voltage which develops across RF choke 86 is roughly proportional to magnitude times the derivative of magnitude. Bias stabilization signal 196 includes a component that is proportional to the derivative of magnitude signal 210 times a delayed function of magnitude signal 210. And, the proportion is characterized by control signal 220.

Accordingly, for each path individually and for both paths collectively, bias distortion estimator 194 estimates an amount by which stabilized bias signal 82 would otherwise fail to match target bias signal 100 and forms bias stabilization signal 196 to compensate for this amount. In the embodiment depicted in FIG. 7, bias stabilization signal 196 is merged with target bias signal 100 by being added to target bias signal 100. Thus, bias stabilization signal 196 is configured to additively combine with sub-RF distortion signals 26 and/or 29 to effect a mutual cancellation of both bias stabilization signal 196 and sub-RF distortion signals 26 and/or 29 in stabilized bias signal 82. This causes stabilized bias signal 82 to become altered to more closely resemble target bias signal 100 than either predistorted bias signal 92 or pre-stabilized bias signal 128 resembles target bias signal 100. Through the bias predistortion of transmitter 32, target bias signal 100 and predistorted bias signal 92 are configured to maximize the PAE of RF power amplifier 36 while maintaining the insensitivity of amplified RF communication signal 35 to modulations of stabilized bias signal 82 by distortion signal 26 and/or 29.

As discussed above in connection with FIG. 3, predistorted bias signal 92 is continuously adjusted to maximize PAE for RF power amplifier 36 while operating transmitter 32 within limits imposed by a spectral mask. The limits imposed by a spectral mask are also limits which maintain linear operation of RF power amplifier 36, maintain operation of RF power amplifier 36 in saturation region 15 (FIG. 1), and maintain insensitivity of RF power amplifier 36 to modulations in the voltage across its conduction channel. Preferably, controller 98 implements a first control loop 222 to manage control signal 103, a second control loop 224 to manage control signal 96, a third control loop 226 to manage control signal 220 and a fourth control loop 228 to manage control signal 204. Each of control loops 222, 224, 226, and 228 is responsive to amplified communication signal 34 (FIG. 3), as expressed through feedback signal 107. Desirably, controller 98 implements control loops 222, 224, 226, and 228 as dither loops having considerably different and substantially uncorrelated dither sequences or having different bandwidths so that the different control loops are substantially independent from one another.

For each of control loops 222, 224, 226, and 228, controller 98 monitors metrics 112 to focus upon out-of-band energy located just outside of RF fundamental bandwidth 18 (FIG. 2) in the electromagnetic spectrum. When controller 98 detects a signal level above the amount permitted by the relevant spectral mask for transmitter 32, action is taken to improve linearity. That action may be to adjust the respective control signal 96, 103, 204, or 220 to promote greater linearity. For example, up to $V_{breakdown}$ (FIG. 1) linearity generally improves when scale factors 204, 220, and 96 increase and when offset 103 increases because load line 14 (FIG. 1) is being moved away from $V_{knee}$ and reducing the risk of operating in triode region 17 (FIG. 1). But movement in this linearity-improving direction typically leads to deterioration in PAE. When controller 98 detects an out-of-band signal level below the spectral mask, opposite actions are taken to improve PAE. As a result, control parameters converge to values that maintain the out-of-band portion of amplified RF communication signal 34 at a substantially constant predetermined power level which complies with the spectral mask, but just barely complies, and PAE is at as high a level as it can be without causing a violation of the spectral mask.

Due to the operation of control loops 222, 224, 226, and 228, a wide range in the absolute and relative quantities of sub-RF distortion signal 26 and/or sub-RF distortion signal 29 may be accommodated and cancelled. Depending upon the precise architecture of RF power amplifier 36 and on the semiconductor technologies involved in manufacturing RF amplifying devices used by RF power amplifier 36, vastly different amounts of sub-RF distortion signal 26 and sub-RF distortion signal 29 may be present. Scale factor control signals 204, 220, and 96 and offset control signal 103 are automatically set to a level corresponding to the levels of sub-RF distortion signals 26 and 29 that may be present, and also adjust target bias signal 100 to optimize PAE while maintaining linear operation.

Control signals 103, 96, 220, and 204 reflect parameters that may change slowly with temperature and/or ageing, or in some applications may not change at all. Accordingly, in order to promote stability, accuracy, and independence of control loops 222, 224, 226, and 228, each of control loops 222, 224, 226, and 228 exhibits a very low loop bandwidth 230 (FIG. 2). Control loop bandwidth 230 is significantly less than bias-generated distortion signal bandwidth 31, the bandwidth of amplifier-generated distortion signal 26, and envelope tracking bandwidth 58. The signal dynamics for bias stabilization signal 196 result from derivative operations conducted in bias distortion estimator 194 rather than from tracking in control loops 222, 224, 226, and 228. In some applications, when the parameters reflected by control signals 103, 96, 220, and 204 hardly change at all, control loops 222, 224, 226, and 228 may be omitted, and constant values may be used for control signals 103, 96, 220, and 204.

In summary, at least one embodiment of the present invention provides a linearized transmitter with a linear RF power amplifier biased using a stabilized bias signal. The stabilized bias signal may be a time-varying signal generated to implement an ET, EER, or hybrid biasing technique. In at least one embodiment of the present invention a method for operating such a transmitter is provided. In at least one embodiment of the present invention, a sub-RF distortion signal generated by the RF power amplifier is cancelled in the stabilized bias signal. In at least one embodiment of the present invention, a sub-RF distortion signal generated by supplying a time-varying bias signal through an RF choke is cancelled in the stabilized bias signal. In at least one embodiment, the canceling of the sub-RF distortion signal allows RF power amplifier operation along a load line closer to its optimal load line while maintaining linear operation. In at least one embodiment, cancellation of the sub-RF distortion signal results from crafting a predistorted bias signal having predistortion components which cancel and are cancelled by sub-RF distortion signals.

Although the preferred embodiments of the invention have been illustrated and described in detail, it will be readily apparent to those skilled in the art that various modifications and adaptations may be made without departing from the spirit of the invention or from the scope of the appended claims. For example, those skilled in the art will appreciate that the specific functions depicted herein through the use of block diagrams and circuit diagrams, signal charts, and the like may be partitioned in equivalent but different ways than shown and discussed herein. Such equivalent but different ways and the modifications and adaptations which may be implemented to achieve them are to be included within the scope of the present invention. Likewise, while certain operational conditions have been mentioned herein for the purposes of teaching the invention, the invention may be applied in connection with other operational conditions. For example, for an EER implementation, bandwidth reduction section 56 may be omitted, trough-filling section 60 may be moved downstream of predistorter 72, and a limiter may be added downstream of both predistorter 72 and trough-filling section 60 to eliminate the envelope prior to upconversion and application at the gate of RF power amplifier 36. In another example, while bias predistortion has been described herein with reference to an additive process, those skilled in the art may devise other mathematical operations which accomplish equivalent bias predistortion results. These and other equivalent modifications and adaptations are included within the scope of the present invention.

What is claimed is:

1. A method of operating a bias-stabilized RF transmitter comprising:
   generating a target bias signal;
   providing a baseband complex communication signal exhibiting a magnitude;
   producing a bias stabilization signal from a derivative with respect to time of the square of said magnitude
   applying a predistorted bias signal formed from said target bias signal and said bias stabilization signal to an input of an envelope amplifier; and
   passing an amplified predistorted bias signal from an output of said envelope amplifier through an RF choke to a conduction channel node of an RF power amplifier, where said amplified predistorted bias signal becomes altered to more closely resemble said target bias signal by a distortion which is a byproduct of amplifying an RF communication signal formed from said baseband complex communication signal.

2. The method claimed in claim 1 additionally comprising converging, in a control loop which is responsive to linearity of said RF power amplifier, upon a scale factor, wherein said producing step produces said bias stabilization signal in response to said scale factor.

3. The method claimed in claim 2 wherein:
said target bias signal exhibits a target bias signal bandwidth and said distortion exhibits a distortion bandwidth greater than said target bias signal bandwidth; and
said control loop has a loop bandwidth less than said distortion bandwidth.

4. The method claimed in claim 1 wherein:
said predistorted bias signal is formed by combining said target bias signal and said bias stabilization signal.

5. The method claimed in claim 1 wherein said target bias signal is an envelope tracking signal which tracks an envelope of said RF communication signal.

6. The method claimed in claim 5 wherein:
said distortion is a first distortion;
said producing step additionally produces said bias stabilization signal in response to a derivative with respect to time of said envelope tracking signal; and
said amplified predistorted bias signal also becomes altered to more closely resemble said target bias signal by a second distortion caused by passing said amplified predistorted bias signal through said RF choke.

7. The method claimed in claim 6 wherein said producing step comprises:
converging, in a control loop which is responsive to linearity of said RF power amplifier, upon a scale factor;
multiplying said derivative with respect to time of said envelope tracking signal by said scale factor to form an estimate of said second distortion;
wherein said bias stabilization signal is produced in response to said estimate of said second distortion.

8. The method claimed in claim 7 wherein:
said envelope tracking signal exhibits an envelope tracking signal bandwidth; and
said control loop has a bandwidth less than said envelope tracking signal bandwidth.

9. The method claimed in claim 8 wherein:
said envelope amplifier is a hybrid envelope amplifier having a linear amplifier coupled to a switching amplifier;
said linear amplifier exhibits a higher bandwidth than is exhibited by said switching amplifier; and
said linear amplifier exhibits a higher bandwidth than said envelope tracking signal bandwidth.

10. The method claimed in claim 9 wherein:
said linear amplifier is a differential amplifier having first and second inputs;
said predistorted bias signal is applied to said first input;
said RF choke has a first node coupled to said output of said envelope amplifier and a second node coupled to said conduction channel node of said RF power amplifier; and
a feedback signal extracted from said second node of said RF choke is applied to said second input.

11. The method claimed in claim 1 wherein said generating step comprises:
forming an envelope tracking signal which tracks an envelope of said RF communication signal;
converging, in a control loop which is responsive to linearity of said RF power amplifier, upon a scale factor; and
multiplying said envelope tracking signal by said scale factor to generate said target bias signal.

12. The method claimed in claim 1 wherein said generating step comprises:
extracting a magnitude signal having a magnitude signal bandwidth from said baseband complex communication signal; and
forming an envelope tracking signal in response to said magnitude signal, said envelope tracking signal being formed to have a lower bandwidth than said magnitude signal bandwidth.

13. The method claimed in claim 1 wherein:
said method additionally comprises converging, in a control loop, upon an offset which minimizes said offset while maintaining linear operation of said RF power amplifier; and
said applying step additionally forms said predistorted bias signal from said offset.

14. The method claimed in claim 1 wherein said envelope amplifier is a hybrid envelope amplifier having a linear amplifier coupled to a switching amplifier, wherein said linear amplifier exhibits a higher bandwidth than said switching amplifier.

15. A method of operating a bias-stabilized RF transmitter comprising:
generating an envelope tracking signal which tracks an envelope of an RF communication signal;
producing a derivative with respect to time of said envelope tracking signal;
delaying said envelope tracking signal to produce a delayed function of said envelope tracking signal;
performing a mathematical operation upon said derivative with respect to time of said envelope tracking signal to produce a bias stabilization signal;
applying a predistorted bias signal formed from said delayed function of said envelope tracking signal and said bias stabilization signal to an input of an envelope amplifier; and
passing an amplified predistorted bias signal from an output of said envelope amplifier through an RF choke to a conduction channel node of an RF power amplifier configured to linearly amplify said RF communication signal by operating in a saturation region for said RF power amplifier, wherein said amplified predistorted bias signal at said conduction channel node of said RF power amplifier becomes altered to more closely resemble said envelope tracking signal by a distortion which results from passing said amplified predistorted bias signal through said RF choke.

16. The method claimed in claim 15 wherein said predistorted bias signal is configured to maximize power-added efficiency of said RF power amplifier while maintaining insensitivity of an amplified RF communication signal produced by said RF power amplifier to modulation by said amplified predistorted bias signal at said conduction channel node of said RF power amplifier.

17. The method claimed in claim 15 additionally comprising converging, in a control loop which is responsive to linearity of said RF power amplifier, upon a scale factor, wherein said mathematical operation produces said bias stabilization signal in response to said scale factor.

18. The method claimed in claim 17 wherein said predistorted bias signal is formed by combining said envelope tracking signal and said bias stabilization signal.

19. The method claimed in claim 17 wherein said generating step comprises:
- converging, in a control loop which is responsive to linearity of said RF power amplifier, upon a scale factor;
- multiplying said envelope tracking signal by said scale factor to produce a scaled envelope tracking signal, wherein said predistorted bias signal is formed from said scaled envelope tracking signal and said bias stabilization signal.

20. The method claimed in claim 15 wherein:
- said method additionally comprises converging, in a control loop, upon an offset which minimizes said offset while maintaining linear operation of said RF power amplifier; and
- said applying step additionally forms said predistorted bias signal from said offset.

21. The method claimed in claim 15 wherein said RF communication signal is formed from a baseband complex communication signal, and said generating step comprises:
- extracting a magnitude signal having a magnitude signal bandwidth from said baseband complex communication signal;
- forming an envelope tracking signal in response to said magnitude signal, said envelope tracking signal being formed to have a lower bandwidth than said magnitude signal bandwidth; and
- detroughing said envelope tracking signal.

22. The method claimed in claim 15 wherein said envelope amplifier is a hybrid envelope amplifier having a linear amplifier coupled to a switching amplifier, wherein said linear amplifier exhibits a higher bandwidth than said switching amplifier.

23. A bias-stabilized RF transmitter comprising:
- an RF choke having first and second nodes;
- an envelope amplifier having an output coupled to said first node of said RF choke and having an input;
- an RF power amplifier having a conduction channel node coupled to said second node of said RF choke and configured to linearly amplify an RF communication signal by operating in a saturation region for said RF power amplifier;
- a target bias signal generator configured to generate a target bias signal that will be transformed into a stabilized bias signal at said conduction channel node of said RF power amplifier, said target bias signal being configured to maximize power-added efficiency of said RF power amplifier while maintaining insensitivity of an amplified RF communication signal produced by said RF power amplifier to variance in said stabilized bias signal;
- a bias distortion estimator configured to estimate an amount by which said stabilized bias signal will fail to match said target bias signal and to form a bias stabilization signal which compensates for said amount; and
- a merging section having inputs coupled to said target bias signal generator and to said bias distortion estimator and having an output coupled to said input of said envelope amplifier, said merging section being configured to form a predistorted bias signal from said target bias signal and said bias stabilization signal;
- wherein said predistorted bias signal is applied to said input of said envelope amplifier, said envelope amplifier generates an amplified predistorted bias signal, said amplified predistorted bias signal passes through said RF choke to said conduction channel node of said RF power amplifier to become transformed by distortion into said stabilized bias signal, and said stabilized actual bias signal more closely resembles said target bias signal than said predistorted bias signal resembles said target bias signal.

24. The bias-stabilized RF transmitter of claim 23 wherein:
- said bias-stabilized RF transmitter provides a baseband complex communication signal exhibiting a magnitude, wherein said RF communication signal is formed from said baseband complex communication signal; and
- said bias distortion estimator is configured to produce said bias stabilization signal from a derivative with respect to time of the square of said magnitude.

25. The bias-stabilized RF transmitter of claim 24 wherein:
- said target bias signal generator causes said target bias signal to track an envelope of said RF communication signal;
- said bias distortion estimator produces a derivative with respect to time of said target bias signal;
- said bias distortion estimator delays said target bias signal to produce a delayed function of said target bias signal; and
- said bias distortion estimator performs a mathematical operation upon said derivative with respect to time of said target bias signal to produce said bias stabilization signal.

26. The bias-stabilized RF transmitter of claim 24 wherein said target bias signal generator causes said target bias signal to track an envelope of said RF communication signal.

27. The bias-stabilized RF transmitter of claim 23 wherein:
- said RF communication signal is formed from a baseband complex communication signal;
- said target bias signal generator forms said target bias signal in response to a magnitude signal extracted from said baseband complex communication signal; and
- said target bias signal exhibits a bandwidth less than a bandwidth exhibited by said magnitude signal.

28. The bias-stabilized RF transmitter of claim 23 wherein:
- said target bias signal generator causes said target bias signal to track an envelope of said RF communication signal;
- said bias distortion estimator produces a derivative with respect to time of said target bias signal;
- said bias distortion estimator delays said target bias signal to produce a delayed function of said target bias signal; and
- said bias distortion estimator performs a mathematical operation upon said derivative with respect to time of said target bias signal to produce said bias stabilization signal.

* * * * *